United States Patent
Sato et al.

(10) Patent No.: US 12,212,872 B2
(45) Date of Patent: Jan. 28, 2025

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventors: Mamoru Sato, Kanagawa (JP); Hideki Naganuma, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 18/245,900

(22) PCT Filed: Jul. 28, 2021

(86) PCT No.: PCT/JP2021/027900
§ 371 (c)(1),
(2) Date: Mar. 20, 2023

(87) PCT Pub. No.: WO2022/064835
PCT Pub. Date: Mar. 31, 2022

(65) Prior Publication Data
US 2024/0357260 A1    Oct. 24, 2024

(30) Foreign Application Priority Data
Sep. 28, 2020 (JP) ................. 2020-161603

(51) Int. Cl.
H04N 25/778  (2023.01)
H01L 27/146  (2006.01)
H04N 25/709  (2023.01)

(52) U.S. Cl.
CPC ..... H04N 25/778 (2023.01); H01L 27/14614 (2013.01); H04N 25/709 (2023.01)

(58) Field of Classification Search
CPC ............... H04N 25/778; H04N 25/709; H01L 27/14614
See application file for complete search history.

(56) References Cited

U.S. PATENT DOCUMENTS 10,027,916 B2 * 7/2018 Ishiwata ............... H04N 25/77
2019/0289240 A1 * 9/2019 Zhu ....................... H04N 25/75
(Continued)

FOREIGN PATENT DOCUMENTS

JP    2018-182496 A    11/2018
JP    2018-182709 A    11/2018
(Continued)

OTHER PUBLICATIONS

International Search Report and Written Opinion of PCT Application No. PCT/JP2021/027900, issued on Oct. 12, 2021, 09 pages of ISRWO.

*Primary Examiner* — Padma Haliyur
(74) *Attorney, Agent, or Firm* — CHIP LAW GROUP

(57) ABSTRACT

To improve an image quality in a solid-state imaging element that performs differential amplification. A reference-side amplification transistor supplies a reference current corresponding to a predetermined reference potential. A read-side amplification transistor supplies a signal current corresponding to a difference between a potential of a gate and the reference potential from a drain to a source. A pair of reset transistors initializes the potential of the gate and the reference potential. A potential control circuit controls a potential difference between the gate and the drain to a predetermined value when the potential of the gate and the reference potential are initialized.

17 Claims, 28 Drawing Sheets

(56) References Cited

U.S. PATENT DOCUMENTS

2019/0394413 A1\* 12/2019 Sato ................... H04N 25/709
2021/0006212 A1\* 1/2021 Watanabe ............ H01L 27/146

FOREIGN PATENT DOCUMENTS

JP        2020-156070 A    9/2020
WO    WO-2019171686 A1 \*   9/2019 ............. H03F 3/082

\* cited by examiner

SOLID-STATE IMAGING ELEMENT AND IMAGING DEVICE

CROSS REFERENCE TO RELATED APPLICATIONS

This application is a U.S. National Phase of International Patent Application No. PCT/JP2021/027900 filed on Jul. 28, 2021, which claims priority benefit of Japanese Patent Application No. JP 2020-161603 filed in the Japan Patent Office on Sep. 28, 2020. Each of the above-referenced applications is hereby incorporated herein by reference in its entirety.

TECHNICAL FIELD

The present technology relates to a solid-state imaging element. Specifically, this relates to a solid-state imaging element provided with a differential amplifier circuit and an imaging device.

BACKGROUND ART

Conventionally, a differential amplification type solid-state imaging device that performs differential amplification has been used in an imaging device. For example, a solid-state imaging device has been proposed in which one of a pair of pixels is a reference pixel, the other is a read pixel, and a current mirror circuit and a current source are connected to these pixels to form a differential amplifier circuit (refer to, for example, Patent Document 1). In the differential amplifier circuit, at the time of initialization, a gate (input of the differential amplifier circuit) of the amplification transistor in the read pixel and a vertical signal line (output of the differential amplifier circuit) are short-circuited by a reset transistor in the read pixel.

CITATION LIST

Patent Document

Patent Document 1: Japanese Patent Application Laid-Open No. 2018-182496

SUMMARY OF THE INVENTION

Problems to be Solved by the Invention

In the above-described conventional technology, floating diffusion layers of both the read pixel and the reference pixel are initialized by short-circuit of input and output of the differential amplifier circuit. However, in the above-described solid-state imaging element, since a vertical signal line is connected to a drain of the amplification transistor, potentials of the drain and gate of the amplification transistor are initialized to substantially the same value due to the short-circuit of the input and output of the differential amplifier circuit. Then, since the drain and gate of the amplification transistor have the same potential, a variation in gain of the amplification transistor increases, and an image quality of image data might be deteriorated.

The present technology is achieved in view of such a situation, and an object thereof is to improve the image quality in the solid-state imaging element that performs differential amplification.

Solutions to Problems

The present technology is achieved to solve the above-described problem, and a first aspect thereof is a solid-state imaging element provided with a reference-side amplification transistor that supplies a reference current corresponding to a predetermined reference potential, a read-side amplification transistor that supplies a signal current corresponding to a difference between a potential of a gate and the reference potential from a drain to a source, a pair of reset transistors that initializes the potential of the gate and the reference potential, and a potential difference control circuit that controls a potential difference between the gate and the drain to a predetermined value when the potential of the gate and the reference potential are initialized. This brings about an effect of reducing a variation in gain of the amplification transistor.

Furthermore, according to the first aspect, the potential difference control circuit may include a potential difference generating element that generates a predetermined potential difference, a fixed voltage-side switch that opens and closes a path between one end of the potential difference generating element and a predetermined fixed voltage, and a signal line-side switch that opens and closes a path between the one end of the potential difference generating element and a read-side vertical signal line that transmits the signal current, and another end of the potential difference generating element may be connected to one of the pair of reset transistors. This brings about an effect that the potential difference is generated at the time of initialization.

Furthermore, according to the first aspect, the fixed voltage-side switch may shift to an open state and the signal line-side switch may shift to a closed state when the potential of the gate and the reference potential are initialized. This brings about an effect that the potential difference is generated at the time of initialization.

Furthermore, according to the first aspect, the potential difference control circuit may further include a power supply-side switch that opens and closes a path between one of the pair of reset transistors and a predetermined power supply voltage. This brings about an effect that the potential difference is generated in a differential mode.

Furthermore, according to the first aspect, in a case where a differential mode in which the potential of the gate is differentially amplified is set, the power supply-side switch may shift to an open state, and in a case where a non-differential mode in which the potential of the gate is not differentially amplified is set, the power supply-side switch may shift to a closed state. This brings about an effect that the potential difference is generated in a differential mode.

Furthermore, according to the first aspect, a reference current generation circuit that generates a predetermined reference current and a bias circuit that supplies a bias voltage corresponding to the reference current to the potential difference control circuit may further be included, in which the potential difference control circuit may further include a current source inserted between the another end of the potential difference generating element and a ground terminal, and the current source may generate a current corresponding to the bias voltage. This brings about an effect that the potential difference is controlled.

Furthermore, according to the first aspect, the reference-side amplification transistor, the read-side amplification transistor, the pair of reset transistors, the potential difference control circuit, and the bias circuit may be provided on a predetermined light reception chip, and the reference current generation circuit may be provided on a predetermined circuit chip. This brings about an effect that the potential difference is controlled in the stacked structure.

Furthermore, according to the first aspect, the reference-side amplification transistor, the read-side amplification transistor, and the pair of reset transistors may be provided on a predetermined light reception chip, and the potential difference control circuit, the bias circuit, and the reference current generation circuit may be provided on a predetermined circuit chip. This brings about an effect that the potential difference is controlled in the stacked structure.

Furthermore, according to the first aspect, a current mirror circuit and a parallel number control-side switch that increases the number of parallel transistors in the current mirror circuit when the potential of the gate and the reference potential are initialized may further be included. This brings about an effect that the current on the read side is controlled.

Furthermore, according to the first aspect, the potential difference generating element may be a diode-connected transistor. This brings about an effect that the potential difference is controlled to a value of the gate-source voltage of the diode-connected transistor.

Furthermore, according to the first aspect, the potential difference generating element may be a resistance element. This brings about an effect that the potential difference is controlled to a value corresponding to the resistance.

Furthermore, according to the first aspect, a vertical drive unit and a system control unit may further be included, in which the read-side amplification transistor and one of the pair of reset transistors may be provided in each of a plurality of read pixels arrayed in a two-dimensional lattice pattern in a pixel array unit, a predetermined number of potential difference control circuits may be provided for each column in the pixel array unit, the vertical drive unit may sequentially select and drive rows in the pixel array unit, and the system control unit may select and drive any one of the predetermined number of potential difference control circuits. This brings about an effect that the potential difference control circuit for each column is switched.

Furthermore, according to the first aspect, the system control unit may randomly select any one of the predetermined number of potential difference control circuits every time a row is read. This brings about an effect that the potential difference control circuit for each column is randomly switched every time the reading is performed.

Furthermore, according to the first aspect, the system control unit may randomly select any one of the predetermined number of potential difference control circuits every time all the rows are read. This brings about an effect that the potential difference control circuit for each column is randomly switched every time the frame is read.

Furthermore, according to the first aspect, a first switch that opens and closes a path between an analog-to-digital converter and a vertical signal line that transmits the signal current and a second switch that opens and closes a path between the analog-to-digital converter and a predetermined vertical reset input line may further be provided, in which one of the pair of reset transistors and the potential difference control circuit may be connected to each other via the vertical reset input line. This brings about an effect that a settling time is shortened.

Furthermore, according to the first aspect, the read-side amplification transistor may include a gate electrode including first and second vertical gate electrode portions embedded in a depth direction from a substrate surface of a semiconductor substrate, each of the first vertical gate electrode portion and the second vertical gate electrode portion may have a structure in which a second electrode width at a second depth from the substrate surface is shorter than a first electrode width at a first depth from the substrate surface, the first depth may be a position of a channel uppermost surface closest to the substrate surface of a channel region between the first vertical gate electrode portion and the second vertical gate electrode portion, the second depth may be a position of a bottom surface of the vertical gate electrode portion farthest from the substrate surface of the first vertical gate electrode portion and the second vertical gate electrode portion, and a direction of the first electrode width and the second electrode width may be the same as a direction of a channel width of the channel region. This brings about an effect of improving a signal-noise (SN) ratio.

Furthermore, a second aspect of the present technology is an imaging device provided with a reference-side amplification transistor that supplies a reference current corresponding to a predetermined reference potential, a read-side amplification transistor that supplies a signal current corresponding to a difference between a potential of a gate and the reference potential from a drain to a source, a pair of reset transistors that initializes the potential of the gate and the reference potential, a potential difference control circuit that controls a potential difference between the gate and the drain to a predetermined value when the potential of the gate and the reference potential are initialized, and a signal processing unit that processes a pixel signal corresponding to the signal current. This brings about an effect that an image quality of image data is improved.

MODE FOR CARRYING OUT THE INVENTION

A mode for carrying out the present technology (hereinafter, referred to as an embodiment) is hereinafter described. The description is given in the following order.
 1. First Embodiment (Example of Controlling Potential Difference)
 2. Second Embodiment (Example of Controlling Potential Difference in Stacked Structure)
 3. Third Embodiment (Example of Controlling Potential Difference by Diode-Connected Transistor)
 4. Fourth Embodiment (Example of Randomly Switching Circuit That Controls Potential Difference)
 5. Fifth Embodiment (Example of Shortening Settling Time and Controlling Potential Difference)
 6. Sixth Embodiment (Example of Suppressing Parasitic Capacitance of Amplification Transistor and Controlling Potential Difference)
 7. Application Example to Mobile Body 1. First Embodiment

[Configuration Example of Solid-State Imaging Element]

Figure 1:
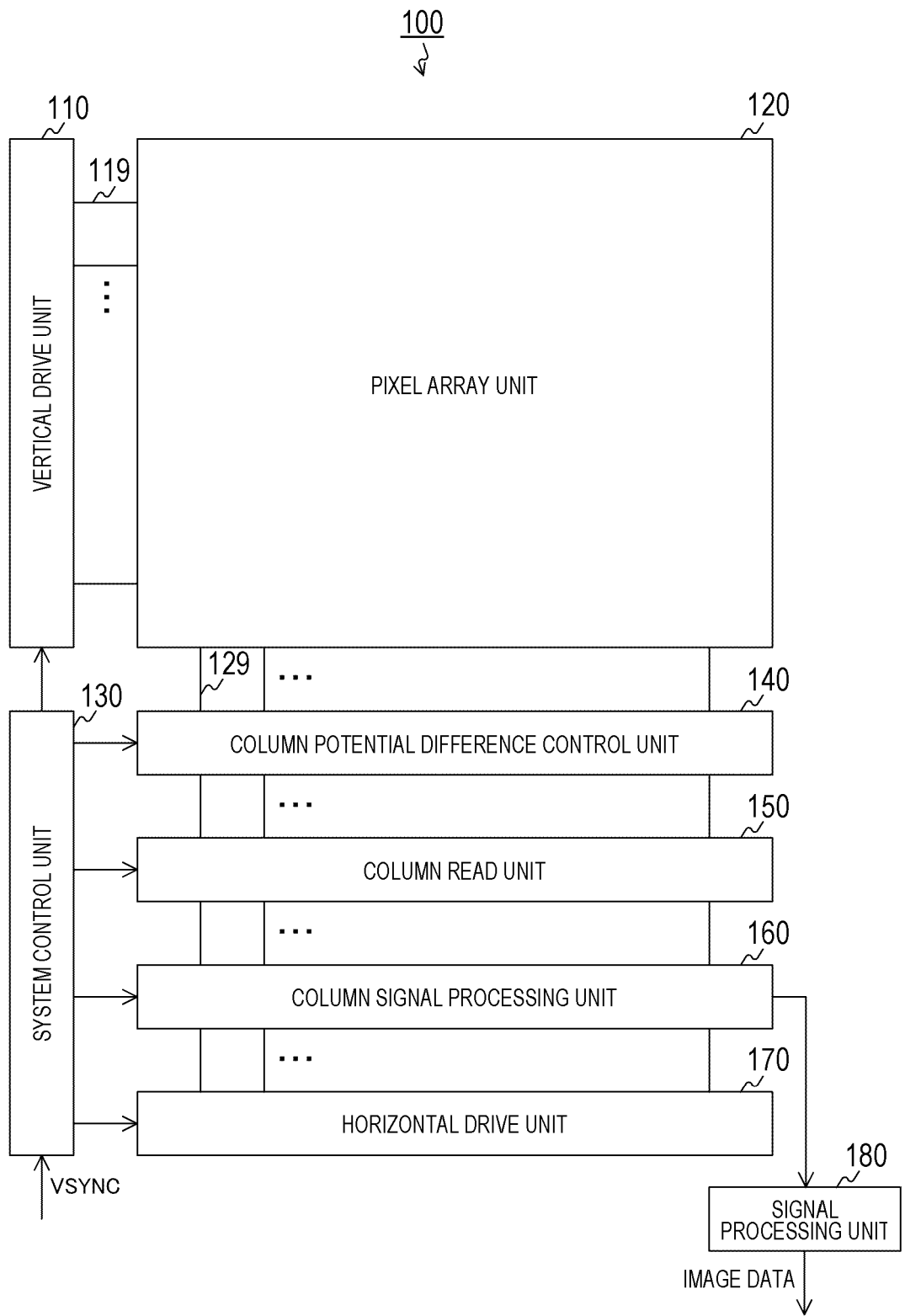
FIG. 1 is a block diagram illustrating a configuration example of a complementary metal oxide semiconductor (CMOS) image sensor according to a first embodiment of the present technology.

FIG. 1 is a block diagram illustrating a configuration example of a CMOS image sensor 100 according to a first embodiment of the present technology. The CMOS image sensor 100 includes a vertical drive unit 110, a pixel array unit 120, a system control unit 130, a column potential difference control unit 140, a column read unit 150, a column signal processing unit 160, a horizontal drive unit 170, and a signal processing unit 180. The circuits are formed on the same semiconductor substrate (chip). Note that, the CMOS image sensor 100 is an example of a solid-state imaging element recited in claims. Furthermore, a device provided with the CMOS image sensor 100 is an example of an imaging device recited in claims.

In the pixel array unit 120, unit pixels (pixels) each including a photoelectric conversion unit (for example, a photodiode) capable of photoelectrically converting a charge amount corresponding to an incident light amount, accumulating the same therein, and outputting the same as a signal are two-dimensionally arranged in a matrix.

Note that, there is a case where the pixel array unit 120 includes a region in which dummy pixels and light-shielding pixels are two-dimensionally arranged in a matrix in addition to effective pixels (effective pixels). Here, the dummy pixel is a pixel having a structure without a photodiode that performs photoelectric conversion, and the light-shielding pixel is a pixel equivalent to the effective pixel except that a light-receiving surface is shielded from light to block incidence of light from the outside.

Furthermore, in the following description, there is a case where an optical charge of the charge amount corresponding to the incident light amount is simply referred to as a "charge", and the unit pixel is simply referred to as a "pixel".

In the pixel array unit 120, moreover, for a pixel array in a matrix, a pixel drive line 119 is formed in a right-to-left direction in the drawing (in an array direction of pixels in a pixel row) for each row, and a vertical pixel wire 129 is formed in a top-to-bottom direction in the drawing (in an array direction of pixels in a pixel column) for each column. One end of the pixel drive line 119 is connected to an output end corresponding to each row of the vertical drive unit 110.

The column read unit 150 at least includes a circuit that supplies a constant current to pixels of a selected row in the pixel array unit 120 for each column, a current mirror circuit forming a high gain amplifier, and a mode selector switch. Furthermore, the column read unit 150 forms an amplifier together with a transistor in the selected pixel in the pixel array unit 120, converts an optical charge signal into a voltage signal, and outputs the same to the vertical pixel wire 129.

The column potential difference control unit 140 is provided between the column read unit 150 and the pixel array unit 120. A configuration of the column potential difference control unit 140 will be described later.

The vertical drive unit 110 is a pixel drive unit including a shift register, an address decoder and the like that drives respective pixels of the pixel array unit 120 all at once, row by row and the like. Although a specific configuration of the vertical drive unit 110 is not illustrated, this includes a read scan system and a sweep scan system, or batch sweep and batch transfer.

The read scan system sequentially selectively scans the pixels of the pixel array unit 120 row by row in order to read signals from the pixels. In a case of row drive (rolling shutter operation), as for sweep, sweep scan is performed on a read row on which read scan is performed by the read scan system prior to the read scan by a time corresponding to a shutter speed.

Furthermore, in a case of global exposure (global shutter operation), the batch sweep is performed prior to the batch transfer by a time corresponding to a shutter speed. By this sweep, an unnecessary charge is swept (reset) from the photoelectric conversion element of the pixel of the read row. Then, a so-called electronic shutter operation is performed by sweeping (resetting) the unnecessary charge.

Here, the electronic shutter operation is intended to mean an operation of discharging the unnecessary optical charge accumulated in the photoelectric conversion element until immediately before and newly starting exposing (starting accumulating the optical charge). The signal read by a read operation by the read scan system corresponds to an amount of light incident after the read operation immediately before or the electronic shutter operation.

In a case of the row drive, a period from a read timing by the read operation immediately before or a sweep timing by the electronic shutter operation to a read timing by a current read operation is an accumulation time of the optical charge (exposure time) in the pixel. In a case of the global exposure, a time from the batch sweep to the batch transfer is the accumulation time (exposure time).

Pixel signals output from the pixels of the pixel row selectively scanned by the vertical drive unit 110 are supplied to the column signal processing unit 160 via the vertical pixel wires 129, respectively. The column signal processing unit 160 performs predetermined signal processing on the pixel signal output from each pixel of the selected row via the vertical pixel wire 129 for each pixel column of the pixel array unit 120, and temporarily holds the pixel signal after the signal processing.

Specifically, the column signal processing unit 160 at least performs, as the signal processing, noise removal processing, for example, correlated double sampling (CDS) processing. By the correlated double sampling by the column signal processing unit 160, reset noise and fixed pattern noise unique to the pixel such as a threshold variation of an amplification transistor are removed. Note that, it is also possible to provide the column signal processing unit 160 with an analog to digital (AD) conversion function, for example, in addition to the noise removal processing and output a signal level as a digital signal. In the column signal processing unit 160, for example, an analog to digital converter (ADC) is provided for each column.

The horizontal drive unit 170 includes a shift register, an address decoder and the like, and sequentially selects unit circuits corresponding to the pixel columns of the column signal processing unit 160. According to selective scan by the horizontal drive unit 170, the pixel signals subjected to the signal processing by the column signal processing unit 160 are sequentially output to the signal processing unit 180.

The system control unit 130 includes a timing generator and the like that generates various types of timing signals. The system control unit 130 controls drive of the vertical drive unit 110, the column signal processing unit 160, the horizontal drive unit 170 and the like on the basis of various timing signals generated by the timing generator.

The signal processing unit 180 at least has an addition processing function and performs various types of signal processing such as addition processing on the pixel signal output from the column signal processing unit 160. The signal processing unit 180 may be an external signal processing unit provided on a substrate different from that of the CMOS image sensor 100, for example, processing by a digital signal processor (DSP) or software. Furthermore, the signal processing unit 180 may be mounted on the same substrate as that of the CMOS image sensor 100.

[Configuration Example of Pixel Array Unit]

Figure 2:
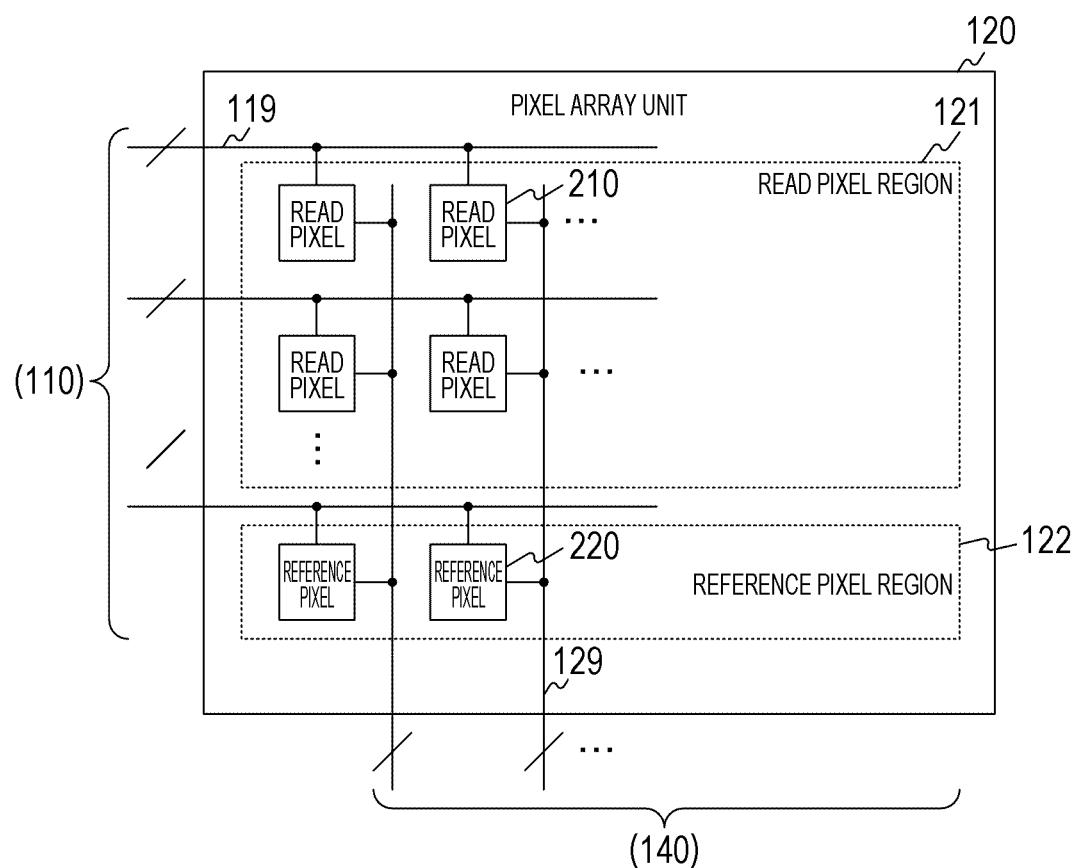
FIG. 2 is a plan view illustrating a configuration example of a pixel array unit according to the first embodiment of the present technology.

FIG. 2 is a plan view illustrating a configuration example of the pixel array unit 120 according the first embodiment of the present technology. The pixel array unit 120 is provided with a reference pixel region 122 and a read pixel region 121. In the reference pixel region 122, a plurality of reference pixels 220 is arrayed in a horizontal direction. In contrast, in the read pixel region 121, a plurality of read pixels 210 is arrayed in a two-dimensional lattice pattern. Here, the read pixel 210 is a pixel from which the pixel signal is to be read. In contrast, the reference pixel 220 is a pixel that outputs a reference signal to be compared with the signal from the read pixel 210 at the time of differential amplification.

Each of the pixels (the reference pixels 220 and the read pixels 210) in the row is connected to the vertical drive unit 110 via the pixel drive line 119. Furthermore, each of the pixels in the column is connected to the column potential difference control unit 140 via the vertical pixel wire 129.

[Configuration Example of Pixel]

Figure 3:
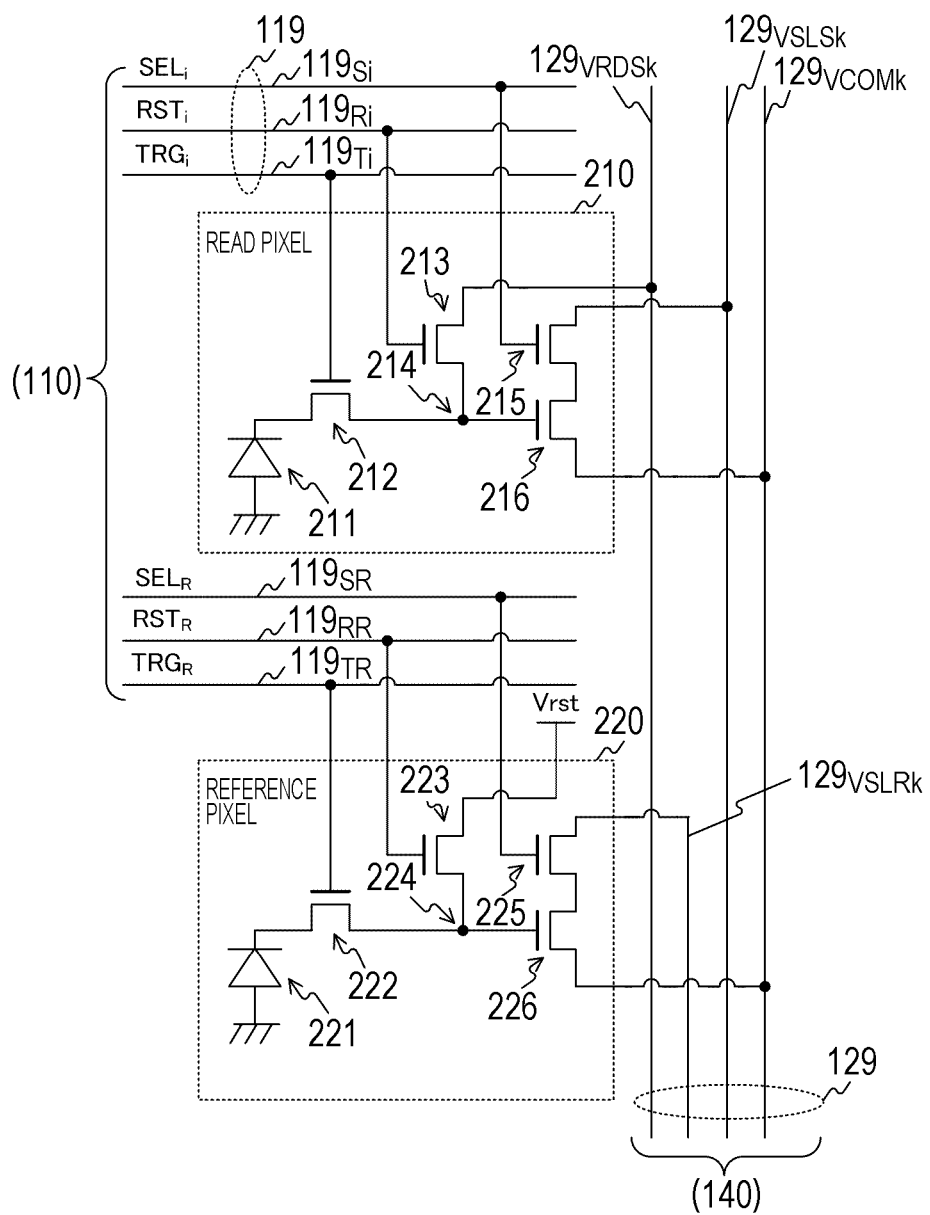
FIG. 3 is a circuit diagram illustrating a configuration example of a read pixel and a reference pixel according to the first embodiment of the present technology.

FIG. 3 is a circuit diagram illustrating a configuration example of the reference pixel 220 and the read pixel 210 according to the first embodiment of the present technology. The reference pixel 220 includes a photoelectric conversion element 221, a transfer transistor 222, a reset transistor 223, a floating diffusion layer 224, a selection transistor 225, and an amplification transistor 226. Furthermore, the read pixel 210 includes a photoelectric conversion element 211, a transfer transistor 212, a reset transistor 213, a floating diffusion layer 214, a selection transistor 215, and an amplification transistor 216.

Furthermore, a selection line $119_{SR}$, a reset line $119_{RR}$, and a transfer line $119_{TR}$ are wired to the row of the reference pixels 220. When the number of rows of the read pixels 210 is set to I (I is an integer), a selection line $119_{Si}$, a reset line $119_{Ri}$, and a transfer line $119_{Ti}$ are wired to an i-th (i is an integer from 0 to I-1) row. When the number of columns is set to K (K is an integer), a read-side vertical reset input line $129_{VRDSk}$, a read-side vertical signal line $129_{VSLSk}$, a reference-side vertical signal line $129_{VSLRk}$, and a vertical current supply line $129_{VCOMk}$ are wired to a k-th (k is an integer from 0 to K-1) column.

In the reference pixel 220, the photoelectric conversion element 221 generates the charge by the photoelectric conversion. The transfer transistor 222 transfers the charge from the photoelectric conversion element 221 to the floating diffusion layer 224 according to a transfer signal $TRG_R$ transmitted via the transfer line $119_{TR}$.

The reset transistor 223 connects the floating diffusion layer 224 to a reset voltage Vrst according to a reset signal $RST_R$ transmitted via the reset line $119_{RR}$, extracts the charge of the floating diffusion layer 224, and initializes a voltage thereof.

The floating diffusion layer 224 accumulates the transferred charge and generates a voltage corresponding to the charge amount.

The amplification transistor 226 amplifies the voltage of the floating diffusion layer 224. A source of the amplification transistor 226 is connected to the vertical current supply line $129_{VCOMk}$.

Note that, as the amplification transistors 216 and 226, for example, a depression type transistor is used.

The selection transistor 225 outputs a signal corresponding to the amplified voltage to the reference-side vertical signal line $129_{VSLRk}$ according to a selection signal $SEL_R$ transmitted via the selection line $119_{SR}$.

A circuit configuration of the read pixel 210 is similar to that of the reference pixel 220. However, a transfer signal $TRG_i$ is transmitted via the transfer line $119_{Ti}$, and a reset signal $RST_i$ is transmitted via the reset line $119_{Ri}$. A selection signal $SEL_i$ is transmitted via the selection line $119_{Si}$. Furthermore, the reset transistor 213 connects the floating diffusion layer 214 to the read-side vertical reset input line $129_{VRDSk}$, and the selection transistor 215 outputs a signal to the read-side vertical signal line $129_{VSLSk}$. A source of the amplification transistor 216 is connected to the vertical current supply line $129_{VCOMk}$.

Figure 4:
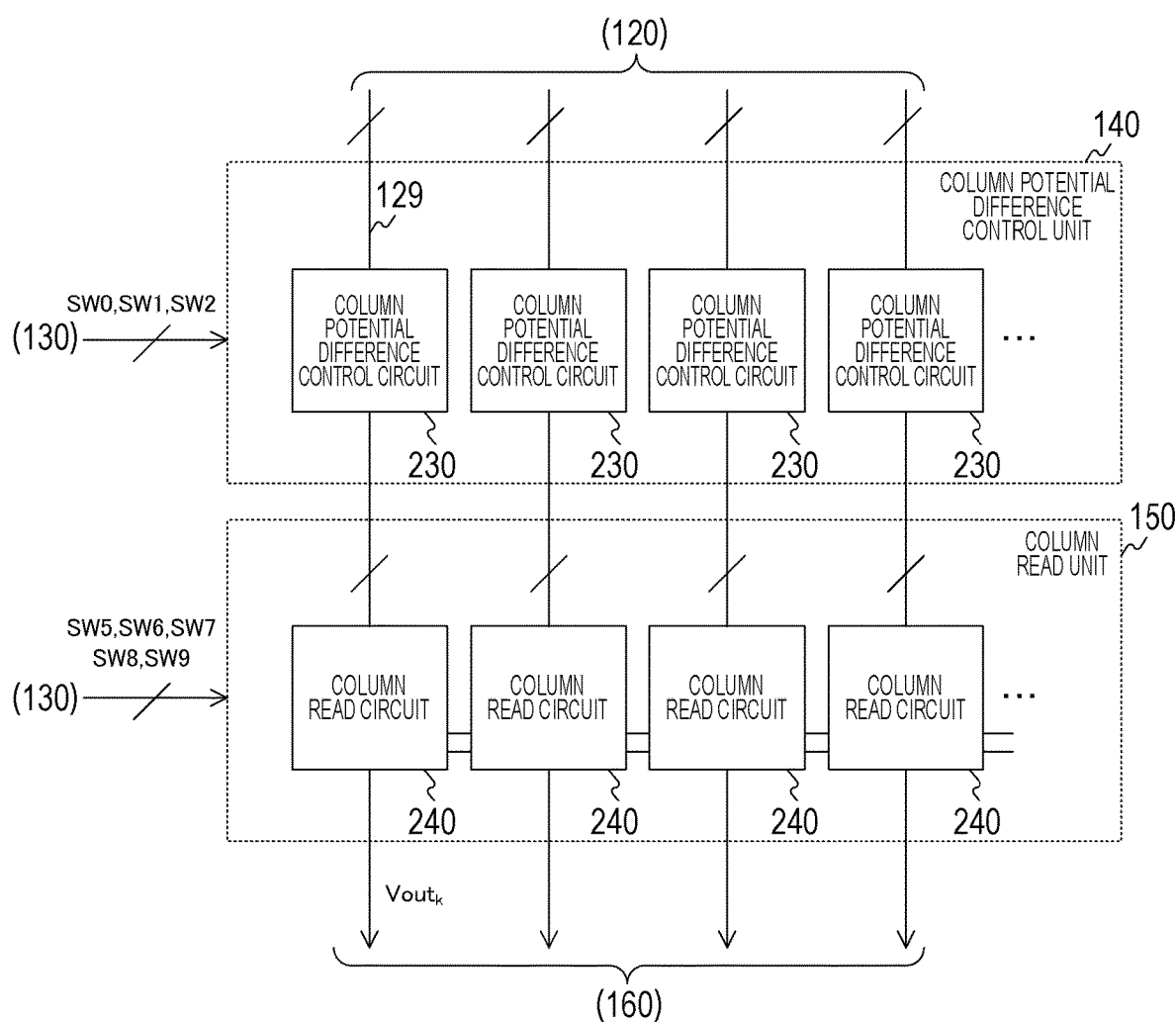
FIG. 4 is a block diagram illustrating a configuration example of a column potential difference control unit and a column read unit according to the first embodiment of the present technology.

FIG. 4 is a block diagram illustrating a configuration example of the column potential difference control unit 140 and the column read unit 150 according to the first embodiment of the present technology.

The column potential difference control unit 140 is provided with a column potential difference control circuit 230 for each column. Furthermore, the column read unit 150 is provided with a column read circuit 240 for each column. The column read circuit 240 in the k-th column outputs a pixel signal Voutk to the column signal processing unit 160.

Control signals SW0, SW1, and SW2 from the system control unit 130 are input to each of the column potential difference control circuits 230. Furthermore, control signals SW5, SW6, SW7, SW8, and SW9 from the system control unit 130 are input to each of the column read circuits 240. Note that, the column potential difference control circuit 230 is an example of a potential difference control circuit recited in claims.

[Configuration Example of Column Potential Difference Control Circuit and Column Read Circuit]

Figure 5:
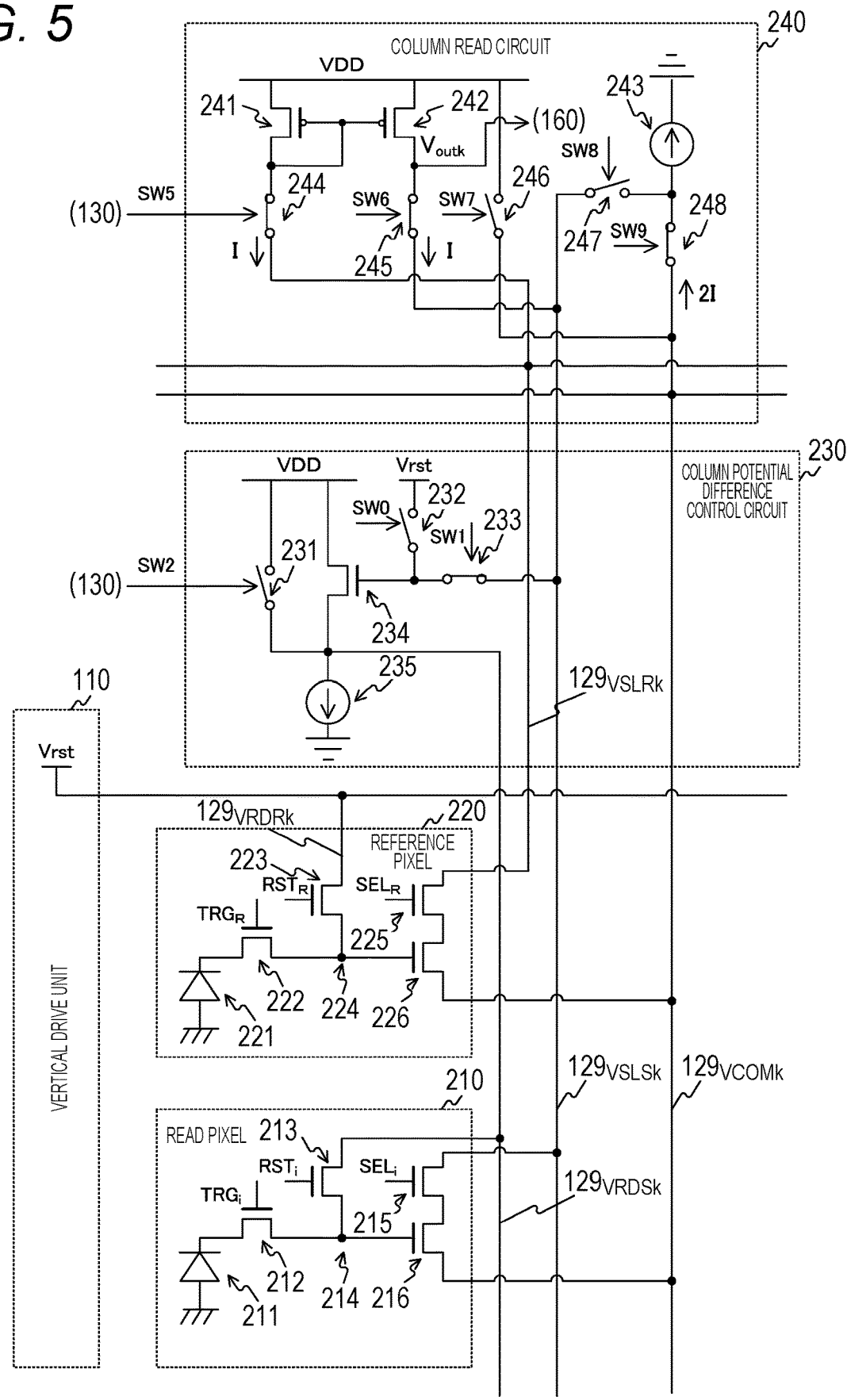
FIG. 5 is a circuit diagram illustrating a configuration example of a column potential difference control circuit, a column read circuit, the read pixel, and the reference pixel according to the first embodiment of the present technology.

FIG. 5 is a circuit diagram illustrating a configuration example of the column read circuit 240, the column potential difference control circuit 230, the read pixel 210, and the reference pixel 220 according to the first embodiment of the present technology.

The column read circuit 240 includes p-channel metal oxide semiconductor (pMOS) transistors 241 and 242, a current source 243, and switches 244 to 248.

The pMOS transistors 241 and 242 are connected in parallel to a power supply voltage VDD. Furthermore, a gate of the pMOS transistor 241 is connected to a drain thereof and a gate of the pMOS transistor 242. The pixel signal Voutk is output from a drain of the pMOS transistor 242 to the column signal processing unit 160. The current source 243 supplies a constant current.

The switch 244 opens and closes a path between the drain of the pMOS transistor 241 and the reference-side vertical signal line $129_{VSLRk}$ according to the control signal SW5 from the system control unit 130.

The switch 245 opens and closes a path between the drain of the pMOS transistor 242 and the read-side vertical signal line $129_{VSLSk}$ according to the control signal SW6 from the system control unit 130.

The switch 246 opens and closes a path between the power supply voltage VDD and the vertical current supply line $129_{VCOMk}$ according to the control signal SW7 from the system control unit 130.

The switch 247 opens and closes a path between the read-side vertical signal line $129_{VSLSk}$ and the current source 243 according to the control signal SW8 from the system control unit 130.

The switch 248 opens and closes a path between the vertical current supply line $129_{VCOMk}$ and the current source 243 according to the control signal SW9 from the system control unit 130.

Here, either a differential mode or an SF mode is set in the CMOS image sensor 100. The differential mode is a mode in which the CMOS image sensor 100 generates a signal obtained by amplifying (by differential amplification) a difference between the pixel signals of a pair of pixels. In contrast, the SF mode is a mode in which a source follower read circuit is formed and the pixel signal is output without the differential amplification.

In the differential mode, a gain with respect to an image signal may be increased and conversion efficiency may be significantly increased, but an operation point is narrow and it is difficult to expand a dynamic range. Therefore, the differential mode is suitable for imaging in a dark place, and the SF mode is suitable for imaging in a bright place. Therefore, for example, a circuit outside the CMOS image sensor 100 measures a light amount of ambient light, and indicates the differential mode in a case where a photometric amount is smaller than a predetermined threshold, and indicates the SF mode in a case where the photometric amount is equal to or larger than the threshold. Note that, the CMOS image sensor 100 itself may perform photometry to set the mode.

When the differential mode is set, the system control unit 130 puts the switches 244, 245, and 248 into a closed state and puts the switches 246 and 247 into an open state by the control signals SW5 to SW9. Therefore, a differential amplifier circuit is formed, and a signal obtained by differentially amplifying the pixel signals of the reference pixel 220 and the read pixel 210 is output as the pixel signal Voutk. In the differential amplifier circuit, a part of 2×I current supplied by the current source 243 flows to the reference-side vertical signal line $129_{VSLRk}$, and the rest flows to the read-side vertical signal line $129_{VSLSk}$. When the floating diffusion layers 214 and 224 are initialized, a reference current flowing to the read-side vertical signal line $129_{VSLSk}$ and a signal current flowing to the read-side vertical signal line $129_{VSLSk}$ have the same value (I).

In contrast, when the SF mode is set, the system control unit 130 puts the switches 244, 245, and 248 into an open state and puts the switches 246 and 247 into a closed state by the control signals SW5 to SW9. Therefore, the pixel signal of the read pixel 210 is output as the pixel signal Voutk without the differential amplification.

Furthermore, in each of the column read circuits 240 of the respective columns, the reference-side vertical signal line $129_{VSLRk}$ and the vertical current supply line $129_{VCOMk}$ are connected (in other words, laterally connected) to each other by a signal line wired in a row direction.

Furthermore, the column potential difference control circuit 230 includes switches 231 to 233, an nMOS transistor 234, and a current source 235. The nMOS transistor 234 and the current source 235 are connected in series between the power supply voltage VDD and a ground terminal. A connection node of the nMOS transistor 234 and the current source 235 is connected to the read-side vertical reset input line $129_{VRDSk}$. Note that, the nMOS transistor 234 is an example of a potential difference generating element recited in claims.

The switch 231 opens and closes a path between the power supply voltage VDD and the read-side vertical reset input line $129_{VRDSk}$ according to the control signal SW2 from the system control unit 130. Note that, the switch 231 is an example of a power supply-side switch recited in claims.

The switch 232 opens and closes a path between the reset voltage Vrst and a gate of the nMOS transistor 234 according to the control signal SW0 from the system control unit 130. The reset voltage Vrst is generated by the vertical drive unit 110, for example, and is supplied to each column. Note that, the reset voltage Vrst is an example of a fixed voltage recited in claims, and the switch 232 is an example of a fixed voltage-side switch recited in claims.

The switch 233 opens and closes a path between the read-side vertical signal line $129_{VSLSk}$ and the gate of the nMOS transistor 234 according to the control signal SW1 from the system control unit 130. Note that, the switch 233 is an example of a signal line-side switch recited in claims.

Furthermore, in the reference pixel 220, the reset voltage Vrst is applied to a drain of the reset transistor 223 via the reference-side vertical reset input line $129_{VRDRk}$. A drain of the selection transistor 225 is connected to the reference-side vertical signal line $129_{VSLRk}$, and the source of the amplification transistor 226 is connected to the vertical current supply line $129_{VCOMk}$.

In the read pixel 210, a drain of the reset transistor 213 is connected to the read-side vertical reset input line $129_{VRDSk}$. The drain of the selection transistor 225 is connected to the read-side vertical signal line $129_{VSLSk}$, and the source of the amplification transistor 226 is connected to the vertical current supply line $129_{VCOMk}$.

The system control unit 130 controls the switch 231 to be in an open state in the differential mode by the control signal SW2. In contrast, in the SF mode, the system control unit 130 controls the switch 231 to be in the open state.

Furthermore, in the differential mode, when the floating diffusion layers 214 and 224 are initialized by the reset signal RST, the system control unit 130 puts the switch 232 into an open state and puts the switch 233 into a closed state by the control signals SW0 and SW1, respectively. Therefore, at the time of initialization, a potential difference between a potential (that is, a gate potential of the amplification transistor 216) of the floating diffusion layer 214 on the read side and a drain potential of the amplification transistor 216 is controlled to a potential difference between the gate and the source of the nMOS transistor 234.

Furthermore, other than the initializing timing in the differential mode, the system control unit 130 puts the switch 232 into a closed state and puts the switch 233 into an open state by the control signals SW0 and SW1, respectively.

Figure 6:
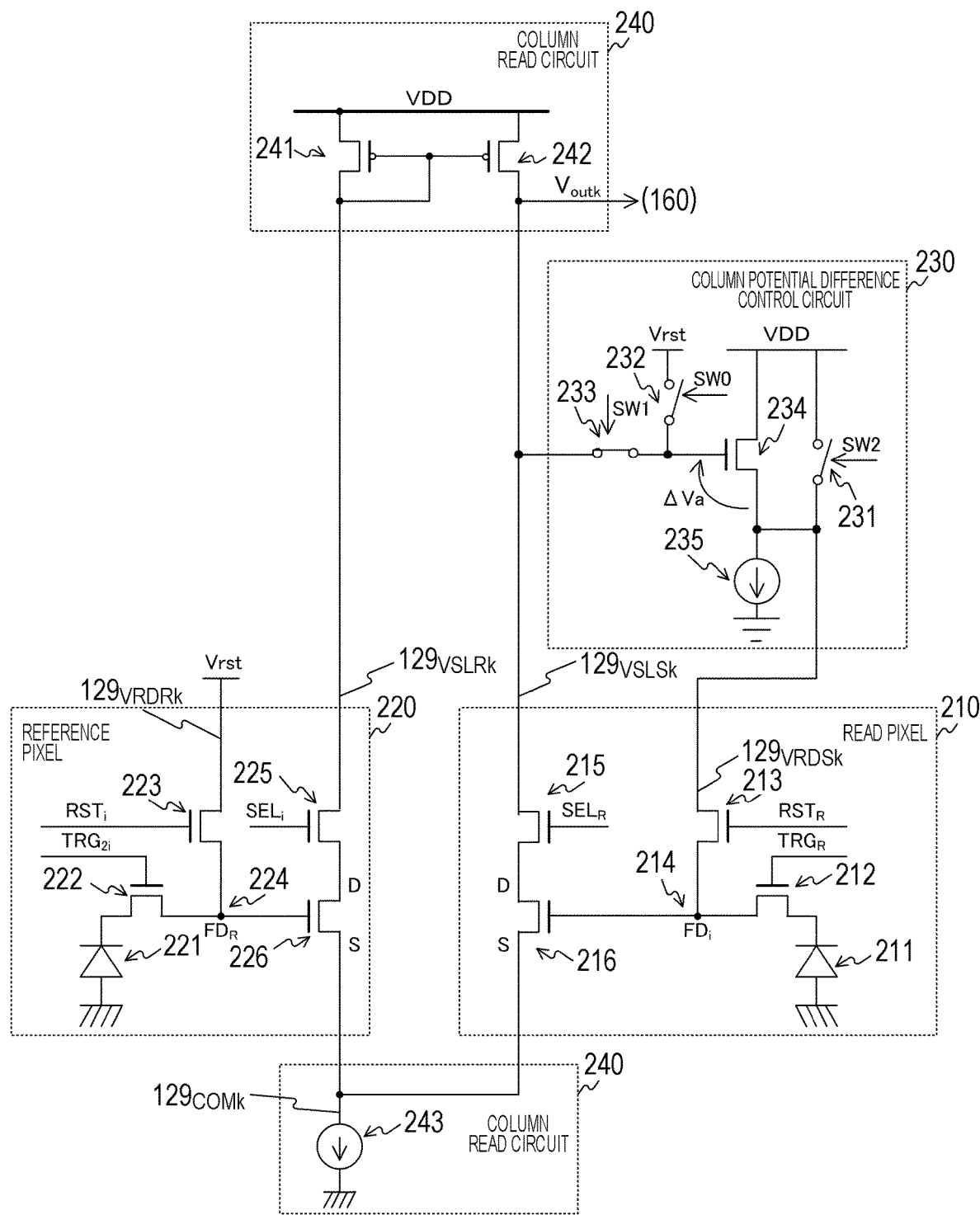
FIG. 6 is a simplified diagram of a differential amplifier circuit according to the first embodiment of the present technology.

FIG. 6 is a simplified diagram of the differential amplifier circuit according to the first embodiment of the present technology. In the drawing, the switches 244 to 248 in the column read circuit 240 are not illustrated for convenience of illustration.

The differential amplifier circuit includes the read pixel 210 to be read, the reference pixel 220 to which a reference voltage is applied, a current mirror circuit arranged in the column read circuit 240, and a tail current source (that is, the current source 243) that supplies a constant current to the pixel. Here, the reference pixel 220 is desirably a pixel in which potential fluctuation of the floating diffusion layer 224 at the time of resetting is equivalent to the potential fluctuation of the floating diffusion layer 214 on the read side.

The reference-side vertical reset input line $129_{VRDRk}$ is connected to a predetermined reset voltage Vrst in the column read circuit 240. At the time of resetting, a desired input voltage signal is applied to the floating diffusion layer 224 (that is, a gate of the amplification transistor 226) of the selected reference pixel 220 via the wire.

The reference-side vertical signal line $129_{VSLRk}$ is connected to the drain and the gate of the pMOS transistor 241 on the reference side and the gate of the pMOS transistor 242 on the read side in the column read circuit 240.

In contrast, the read-side vertical signal line $129_{VSLSk}$ is connected to the drain of the pMOS transistor 242 on the read side in the column read circuit 240. Furthermore, the read-side vertical signal line $129_{VSLSk}$ is connected to an input node of the column potential difference control circuit 230. An output of the column potential difference control circuit 230 (read-side vertical reset input line $129_{VRDSk}$) is connected to the floating diffusion layer 214 (that is, the gate of the amplification transistor 216) of the selected read pixel 210 via the reset transistor 213. By this connection, an output signal of the differential amplifier circuit is negatively fed back. The output signal (pixel signal Voutk) of the differential amplifier circuit is extracted from the read-side vertical signal line $129_{VSLSk}$.

Furthermore, the read-side vertical signal line $129_{VSLSk}$ and the reference-side vertical signal line $129_{VSLRk}$ are connected to each other and then connected to the tail current source (current source 243) that is a constant current source.

A drain of the nMOS transistor 234 is connected to the power supply voltage VDD, for example, and a circuit connected in this manner is referred to as a source follower circuit. Furthermore, the column read circuit 240 and the read pixel 210 in the SF mode also form a source follower circuit separately from that of the nMOS transistor 234. In order to distinguish them, the circuit of the nMOS transistor 234 is simply referred to as a "source follower circuit", and the column read circuit 240 and the read pixel 210 in the SF mode are referred to as a "source follower read circuit".

The switch 233 is arranged between the gate of the nMOS transistor 234 that generates the potential difference and the read-side vertical signal line $129_{VSLSk}$, so that electrical connection may be turned on/off. Furthermore, the switch 231 that operates exclusively with the switch 233 is arranged, and a voltage of a gate of the source follower circuit is fixed to a predetermined voltage (for example, the reset voltage Vrst). The switch 231 is a switch that connects the read-side vertical reset input line $129_{VRDSk}$ and the power supply voltage VDD, and is controlled to be an on state at the time of SF reading.

Here, suppose a differential amplifier circuit that short-circuits the read-side vertical reset input line $129_{VRDSk}$ and the read-side vertical signal line $129_{VSLSk}$ at the time of initialization of the floating diffusion layer without providing the column potential difference control circuit 230 as a comparative example. At the time of initialization of this comparative example, the amplification transistor 216 of the read pixel 210 is diode-connected, and the following expression holds.

$$Vgs = Vds \qquad \text{Expression 1}$$

In the expression described above, Vgs represents a gate-source voltage of the amplification transistor 216, and Vds represents a drain-source voltage of the amplification transistor 216.

Furthermore, since the differential amplifier circuit of the comparative example is a voltage follower circuit and a differential input end is imaginarily short-circuited, the floating diffusion layer 214 of the read pixel 210 and the read-side vertical signal line $129_{VSLSk}$ have voltages equivalent to the reset voltage Vrst.

After the reset is canceled, the potential of the floating diffusion layer is shifted by $\Delta V_{FT}$ by reset feedthrough. In a case where a layout correlation between the read pixel 210 and the reference pixel 220 is high, the reset feedthrough of each pixel has an equivalent fluctuation. Therefore, in-phase reset feedthrough is input to two inputs of + and − of a differential amplifier, but since the signals are in-phase signals, this does not affect an output amplitude of the read-side vertical signal line $129_{VSLSk}$, and a value of the reset voltage Vrst set at the time of reset is maintained. Therefore, an operating point of the amplification transistor 216 after the reset is expressed by the following expression.

$$Vgs'+\Delta V_{FT} \approx Vds'$$

In the expression described above, Vgs' represents a gate-source voltage of the amplification transistor 216 after the reset is canceled, and Vds' represents a drain-source voltage of the amplification transistor 216 after the reset is canceled.

Furthermore, the potential of the vertical current supply line $129_{VCOMk}$ (that is, the source of the amplification transistor 216) is also shifted by the reset feedthrough. Here, in order for the amplification transistor 216 to operate in a saturated region, the following expression needs to be satisfied.

$$Vds \geq Vdsat \quad\quad\text{Expression 2}$$

$$Vdsat = Vgs - Vth \quad\quad\text{Expression 3}$$

In the expression described above, Vth represents a threshold voltage of the amplification transistor 216.

Furthermore, in a case where an open loop gain of the differential amplifier circuit is set to −Av, charge-voltage conversion efficiency $\eta_{s1}$ in the read-side vertical signal line $129_{VSLSk}$ is expressed by the following expression.

$$\eta_{vs1} = e/\{C_{fd}/(-Av)+(C_{gd}+C_{fd-vsl})\} \quad\quad\text{Expression 4}$$

In the expression described above, e represents an elementary electrical charge, and a unit thereof is, for example, coulomb (C). $C_{fd}$ represents a capacitance of the floating diffusion layer 214. $C_{gd}$ represents a parasitic capacitance between the gate and the drain of the amplification transistor 216. $C_{fd-vsl}$ represents a parasitic capacitance between the floating diffusion layer 214 and the read-side vertical signal line $129_{VSLSk}$. The unit of these capacitances is, for example, farad (F).

In the comparative example, since Expression 1 holds, Expressions 2 and 3 cannot be satisfied, and a difference between the drain-source voltage Vds and Vdsat becomes small. This difference is referred to as a "saturated region operation margin".

When the saturated region operation margin is small, an absolute value of the open loop gain (−Av) becomes small, and a contribution ratio of $C_{fd}/(-Av)$ of Expression 4 becomes large. Therefore, a gain variation $\Delta Av$ of the amplification transistor 216 increases. The increase in gain variation $\Delta Av$ deteriorates a photo response non-uniformity (PRNU) characteristic. The deterioration in PRNU characteristic deteriorates an image quality of the image data.

In contrast, in a case where the column potential difference control circuit 230 is provided, the column potential difference control circuit 230 may control the potential difference between the gate and the drain of the amplification transistor 216 to the value of $\Delta Va$ generated by the nMOS transistor 234 at the time of reset. The potential difference $\Delta Va$ is set to be equal to or larger than the threshold voltage Vth, for example. Therefore, the saturated region operation margin increases, and Expressions 2 and 3 may be satisfied. As a result, the absolute value of the open loop gain (−Av) becomes large, the contribution ratio of $C_{fd}/(-Av)$ of Expression 4 becomes small, and the gain variation $\Delta Av$ of the amplification transistor 216 becomes small. Since the gain variation $\Delta Av$ becomes small, the PRNU characteristic becomes excellent, and the image quality may be improved.

Figure 7:
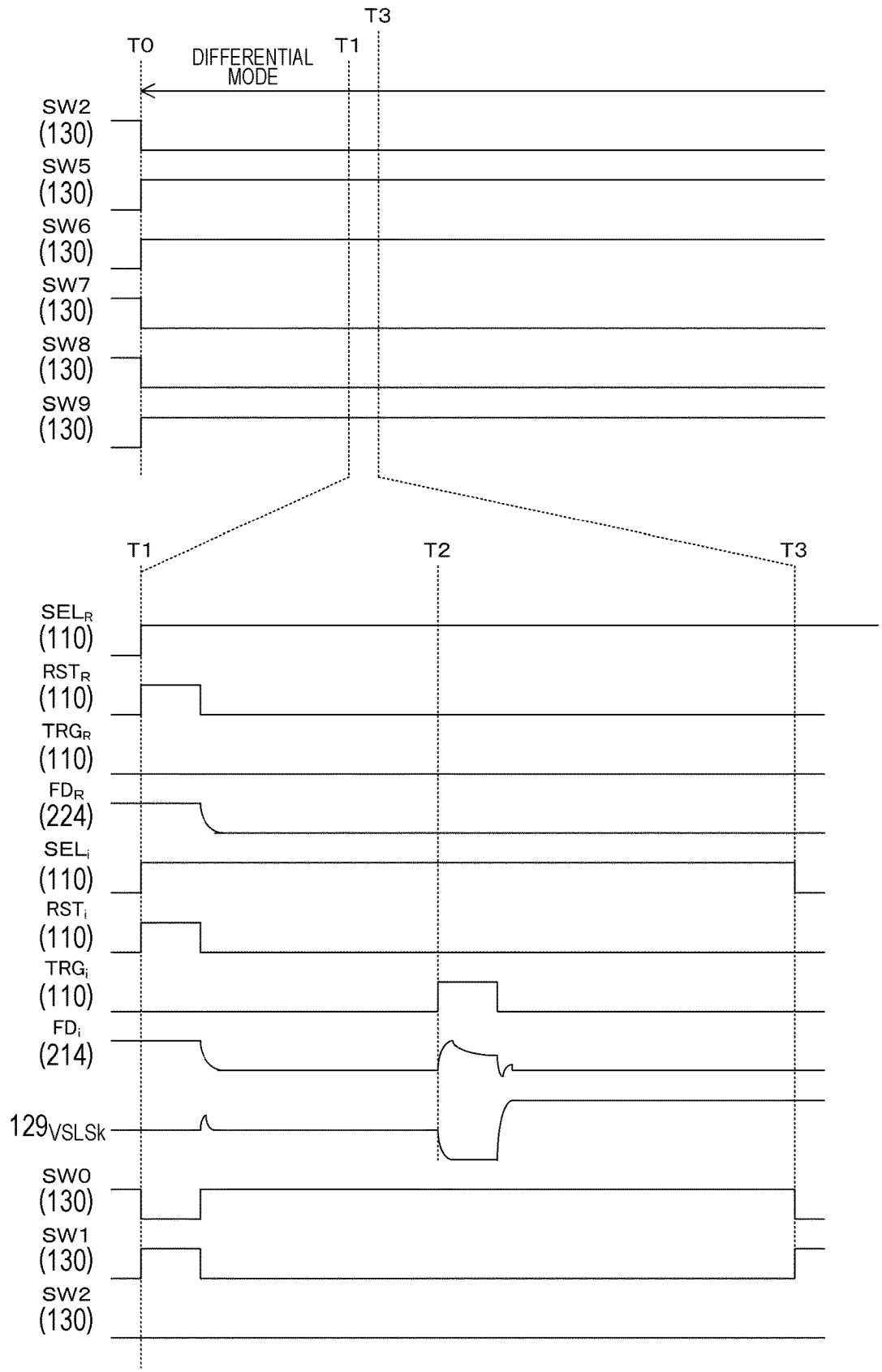
FIG. 7 is a timing chart illustrating an example of an operation of a solid-state imaging element in a differential mode in the first embodiment of the present technology.

FIG. 7 is a timing chart illustrating an example of an operation of the CMOS image sensor 100 in the differential mode according to the first embodiment of the present technology. Hereinafter, each of the control signals SW0 to SW2 and SW5 to SW9 is set to a high level when the corresponding switch is put into a closed (in other words, on) state, and is set to a low level when the corresponding switch is put into an open (in other words, off) state. Furthermore, suppose that the differential mode is set at timing T0. The system control unit 130 sets the control signals SW2, SW7, and SW8 to the low level and sets the control signals SW5, SW6, and SW9 to the high level.

In the differential mode, the vertical drive unit 110 sequentially selects and exposes the rows. A reset level and a signal level of the selected rows are sequentially AD-converted within an AD conversion period from timing T1 to timing T3 immediately before the exposure of the row ends. The reset level is a level of the pixel signal when the floating diffusion layer 214 of the read pixel 210 is initialized, and the signal level is a level of the pixel signal when the charge is transferred to the floating diffusion layer 214 of the read pixel 210. Processing of obtaining a difference therebetween is performed as the CDS processing.

During the AD conversion period from timing T1 to timing T3, the selection signals $SEL_i$ and $SEL_R$ of the selected read pixel and reference pixel, respectively, are switched from the low level to the high level. At that time, a current is supplied from the tail current source (current source 243) from the source to the drain of the amplification transistor on each of the read side and the reference side. Therefore, the differential amplifier circuit using the potential of the floating diffusion layer of the selected read pixel as the input voltage signal operates, and the amplified voltage signal is output from the vertical signal line on the read side. This state continues until the selection signals $SEL_i$ and $SEL_R$ reach the low level.

When high-level reset signals $RST_i$ and $RST_R$ are transmitted over a predetermined pulse period from timing T1, the charge accumulated in the floating diffusion region of each of the read pixel and the reference pixel is discharged, and the signal level is initialized (reset). At that time, the control signal SW1 is at the high level, and the read-side vertical signal line $129_{VSLSk}$ is connected to the gate of the source follower circuit in the column potential difference control circuit 230.

An output of the source follower circuit (the read-side vertical reset input line $129_{VRDSk}$) is electrically connected to the floating diffusion layer 214 on the read side (one of the two inputs of the differential amplifier circuit) via the reset transistor 213 on the read side. As a result, in the differential amplifier circuit, the voltage of the read-side vertical signal line $129_{VSLSk}$ is shifted by a gate-source voltage (that is, the potential difference $\Delta Va$) of the source follower circuit, and is negatively fed back to the input side (floating diffusion layer 214). At that time, since a virtual grounding state is established, the other input (the floating diffusion layer 224) fixed by external application of the reset voltage Vrst and the floating diffusion layer 214 on the read side have the same voltage. Furthermore, the voltage of the read-side vertical signal line $129_{VSLSk}$ is the sum of the reset voltage Vrst and the potential difference ΔVa.

When the reset signals $RST_i$ and $RST_R$ shift to a low level, the floating diffusion layers of the read pixel and the reference pixel are electrically disconnected from the respective vertical reset input lines and enter a floating state. At that time, since the floating diffusion layers 214 and 223 have substantially equivalent structures, potential fluctuations at the time of reset off (that is, the reset feed-through) are substantially the same, and behavior of each potential is substantially the same. Therefore, the output of the differential amplifier circuit hardly changes from the value at the time of reset on, and this state becomes the reset state in differential amplification reading, and this output level becomes the above-described reset level. This is because the differential amplifier circuit does not amplify in-phase signal components of both inputs. This reset level is AD-converted by the column signal processing unit 160 in a period from immediately after timing T1 until timing T2.

Next, at timing T2, when the transfer signal $TRG_i$ of the read pixel is transmitted over the pulse period, the charge accumulated in the photoelectric conversion element 211 of the read pixel is transferred to the floating diffusion layer 214 by the transfer transistor 212. The potential of the floating diffusion layer of the read pixel is modulated by the transferred charge, and this is input as a voltage signal to the gate of the amplification transistor 216 of the read pixel. As a result, a voltage signal corresponding to the accumulated charge amount is output from the read-side vertical signal line $129_{VSLSk}$. This signal level is AD-converted by the column signal processing unit 160 in a period from immediately after timing T2 until timing T3. The column signal processing unit 160 performs the CDS processing by subtracting the reset level from the signal level, and generates the pixel signal from which the fixed pattern noise and offset are removed.

The system control unit 130 exclusively sets the control signal SW0 to the high level within a period in which the control signal SW1 is at the low level so that the gate of the source follower circuit does not enter the floating state.

Figure 8:
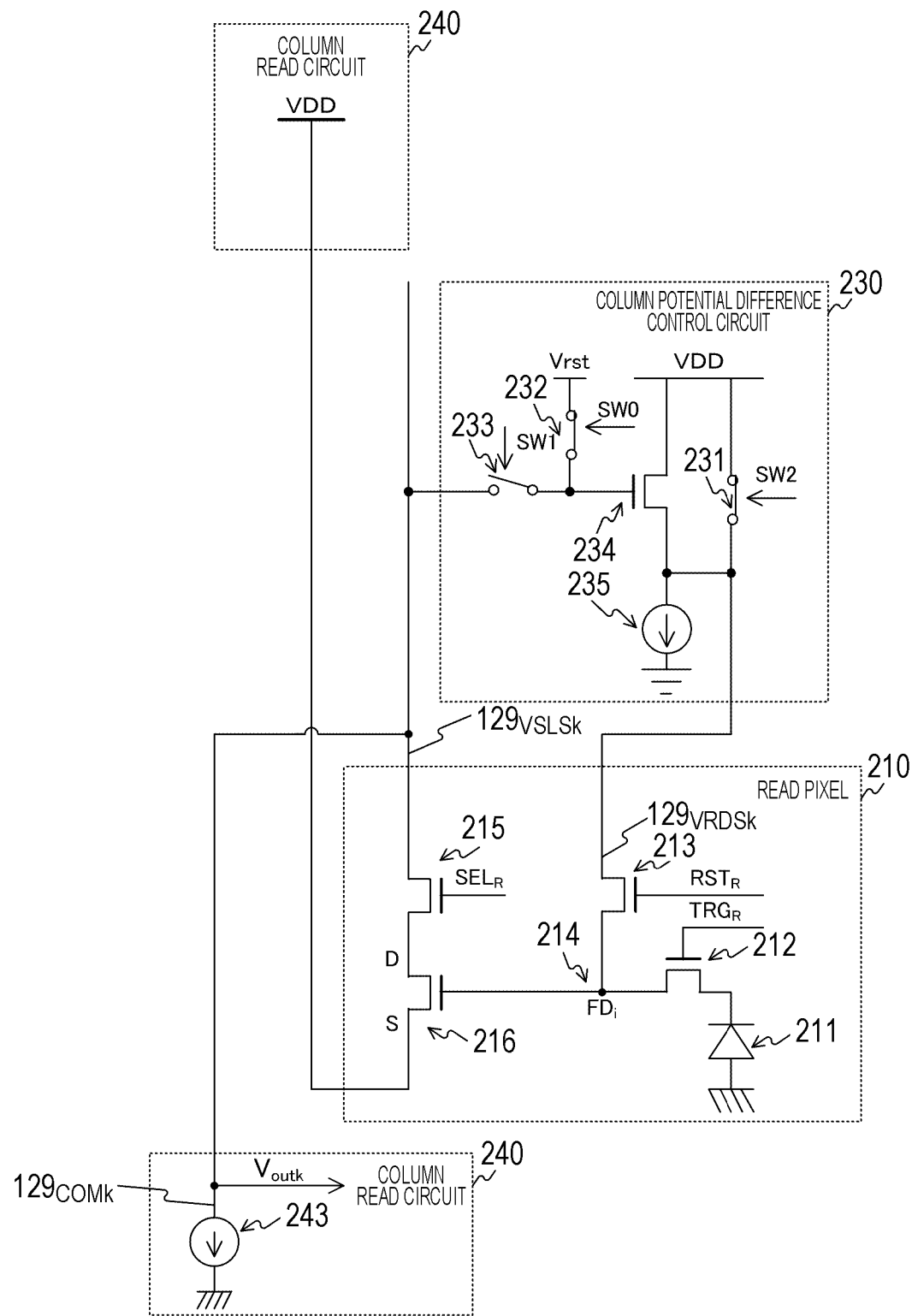
FIG. 8 is a simplified diagram of a source follower read circuit according to the first embodiment of the present technology.

FIG. 8 is a simplified diagram of the source follower read circuit according to the first embodiment of the present technology. In the SF mode, the source follower read circuit with low conversion efficiency is formed as illustrated in the drawing.

The source follower read circuit includes the read pixel 210 to be read and the current source 243 that serves as a load MOS current source. The reference pixel 220 is not illustrated in the drawing because this is disconnected from the source follower read circuit and does not contribute thereto.

The read-side vertical signal line $129_{VSLSk}$ is connected to the load MOS current source (that is, the current source 243). The read-side vertical reset input line $129_{VRDSk}$ to which the power supply voltage VDD is applied via the switch 231 is connected to the floating diffusion layer 214 (the gate of the amplification transistor 216) of the selected read pixel 210 via the reset transistor 213. The pixel signal Voutk is extracted from the read-side vertical signal line $129_{VSLSk}$.

Figure 9:
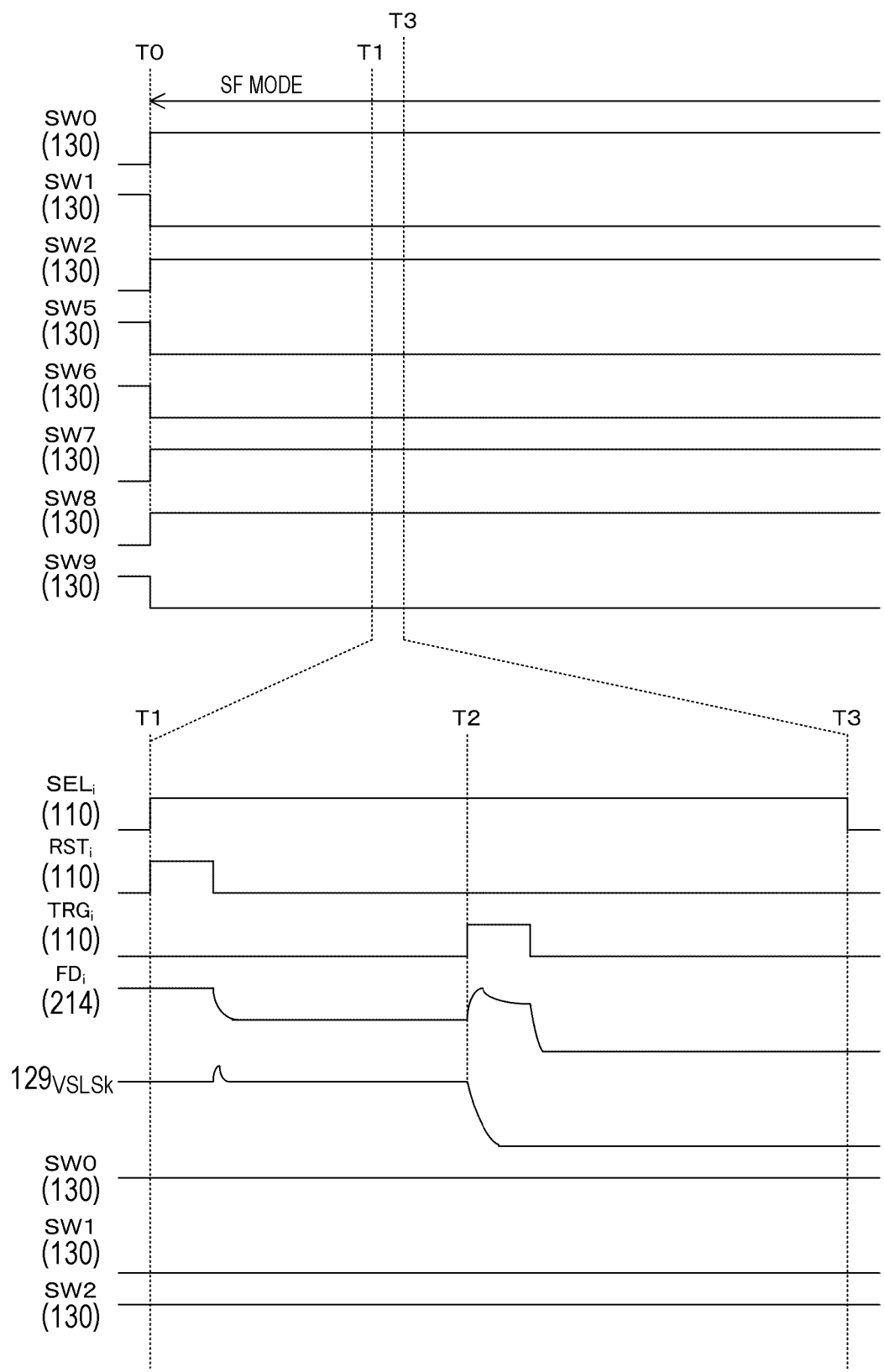
FIG. 9 is a timing chart illustrating an example of an operation of a CMOS image sensor in an SF mode according to the first embodiment of the present technology.

FIG. 9 is a timing chart illustrating an example of an operation of the CMOS image sensor 100 in the SF mode according to the first embodiment of the present technology. Suppose that the SF mode is set at timing T0. The system control unit 130 sets the control signals SW0, SW2, SW7, and SW8 to the high level, and sets the control signals SW1, SW5, SW6, and SW9 to the low level.

In the SF mode, the vertical drive unit 110 sequentially selects and exposes the rows. A reset level and a signal level of the selected rows are sequentially AD-converted within an AD conversion period from timing T1 to timing T3 immediately before the exposure of the row ends.

During the AD conversion period from timing T1 to timing T3, the selection signal $SEL_i$ of the selected read pixel is switched from the low level to the high level. At that time, a current is supplied from the drain to the source of the amplification transistor 316, the source follower circuit that uses the potential of the floating diffusion layer 214 of the selected read pixel as an input voltage signal operates, and a voltage signal is output from the vertical signal line on the read side. This state continues until the selection signal $SEL_i$ reaches the low level.

When the high-level reset signal $RST_i$ is transmitted over a predetermined pulse period from timing T1, the charge accumulated in the floating diffusion layer 214 of the read pixel is discharged, and the signal level is initialized (reset). At that time, the control signal SW2 is always at the high level. Since the source follower circuit in the column potential difference control circuit does not contribute to the operation of this drive, the system control unit 130 sets the control signal SW0 to the high level and sets the control signal SW1 to the low level, for example.

When the reset signal $RST_i$ shifts to the low level, the floating diffusion layer 214 of the read pixel is electrically disconnected from the vertical reset input line on the read side and enter a floating state. This reset level is AD-converted by the column signal processing unit 160 in a period from immediately after timing T1 until timing T2.

Next, at timing T2, when the transfer signal $TRG_i$ of the read pixel is transmitted over the pulse period, the charge accumulated in the photoelectric conversion element 211 of the read pixel is transferred to the floating diffusion layer 214 by the transfer transistor 212. The potential of the floating diffusion layer of the read pixel is modulated by the transferred charge, and this is input as a voltage signal to the gate of the amplification transistor 216 of the read pixel. This signal level is AD-converted by the column signal processing unit 160 in a period from immediately after timing T2 until timing T3. The column signal processing unit 160 performs the CDS processing by subtracting the reset level from the signal level, and generates the pixel signal from which the fixed pattern noise and offset are removed.

Figure 10:
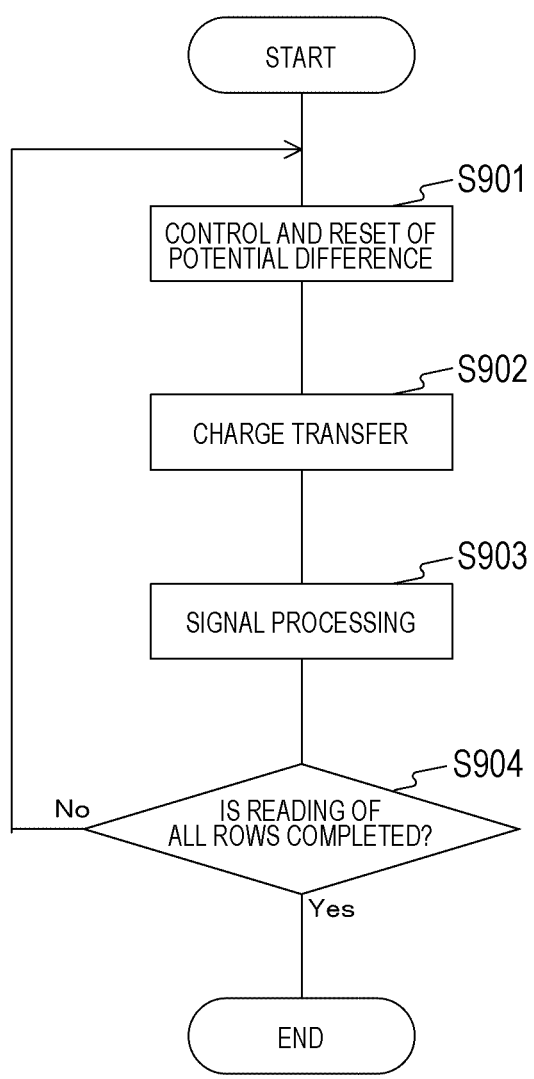
FIG. 10 is a flow chart illustrating an example of an operation of the CMOS image sensor in the differential mode according to the first embodiment of the present technology.

FIG. 10 is a flow chart illustrating an example of an operation of the CMOS image sensor 100 in the differential mode according to the first embodiment of the present technology. This operation is started, for example, when the differential mode is set.

The CMOS image sensor 100 selects a row, and resets the floating diffusion layer while controlling the potential difference between the gate and the drain of the amplification transistor 216 of the selected row to ΔVa (step S901). The CMOS image sensor 100 transfers the charge to the floating diffusion layer of the selected row (step S902), and performs signal processing such as AD conversion processing and CDS processing (step S903).

The CMOS image sensor 100 determines whether or not reading of all the rows is completed (step S904). In a case where the reading of all the rows is not completed (step S904: No), the CMOS image sensor 100 repeats step S901 and subsequent steps. In contrast, in a case where the reading of all the rows is completed (step S904: Yes), the CMOS image sensor 100 finishes the operation for imaging.

Note that, when continuously imaging a plurality of image data, steps S901 to S904 are repeatedly executed in synchronization with a vertical synchronization signal.

In this manner, according to the first embodiment of the present technology, since the column potential difference control circuit 230 sets the potential difference between the gate and the drain of the amplification transistor 216 to ΔVa at the time of initialization, the amplification transistor 216 may be operated in the saturated region. Therefore, the variation in gain of the amplification transistor 216 for each pixel becomes small, and the image quality of the image data may be improved.

2. Second Embodiment

In the first embodiment described above, each of the circuits in the CMOS image sensor 100 is provided on a single semiconductor substrate (chip). However, in a case where they are provided on the single semiconductor chip, it is necessary to arrange the vertical drive unit 110 and the like in addition to the pixel array unit 120 on the chip. Therefore, when an area of the semiconductor chip is fixed, an area of the pixel array unit 120 decreases by the circuits other than the pixel array unit 120. A CMOS image sensor 100 of a second embodiment is different from that of the first embodiment in that circuits are arranged in a distributed manner on a plurality of stacked semiconductor chips.

Figure 11:
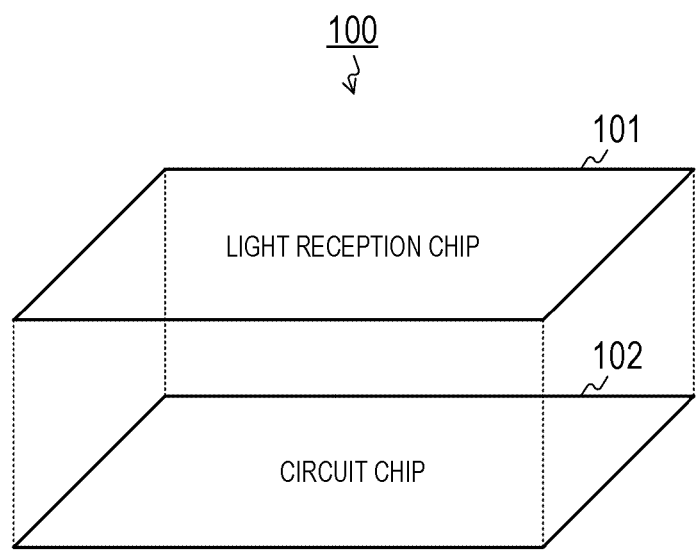
FIG. 11 is a diagram illustrating an example of a stacked structure of a CMOS image sensor according to a second embodiment of the present technology.

FIG. 11 is a diagram illustrating an example of a stacked structure of the CMOS image sensor 100 according to the second embodiment of the present technology. The CMOS image sensor 100 of the second embodiment includes a circuit chip 102 and a light reception chip 101 stacked on the circuit chip 102. These chips are electrically connected to each other via a connection unit such as a via. Note that, they may also be connected to each other by Cu—Cu joint or a bump in addition to the via.

Figure 12:
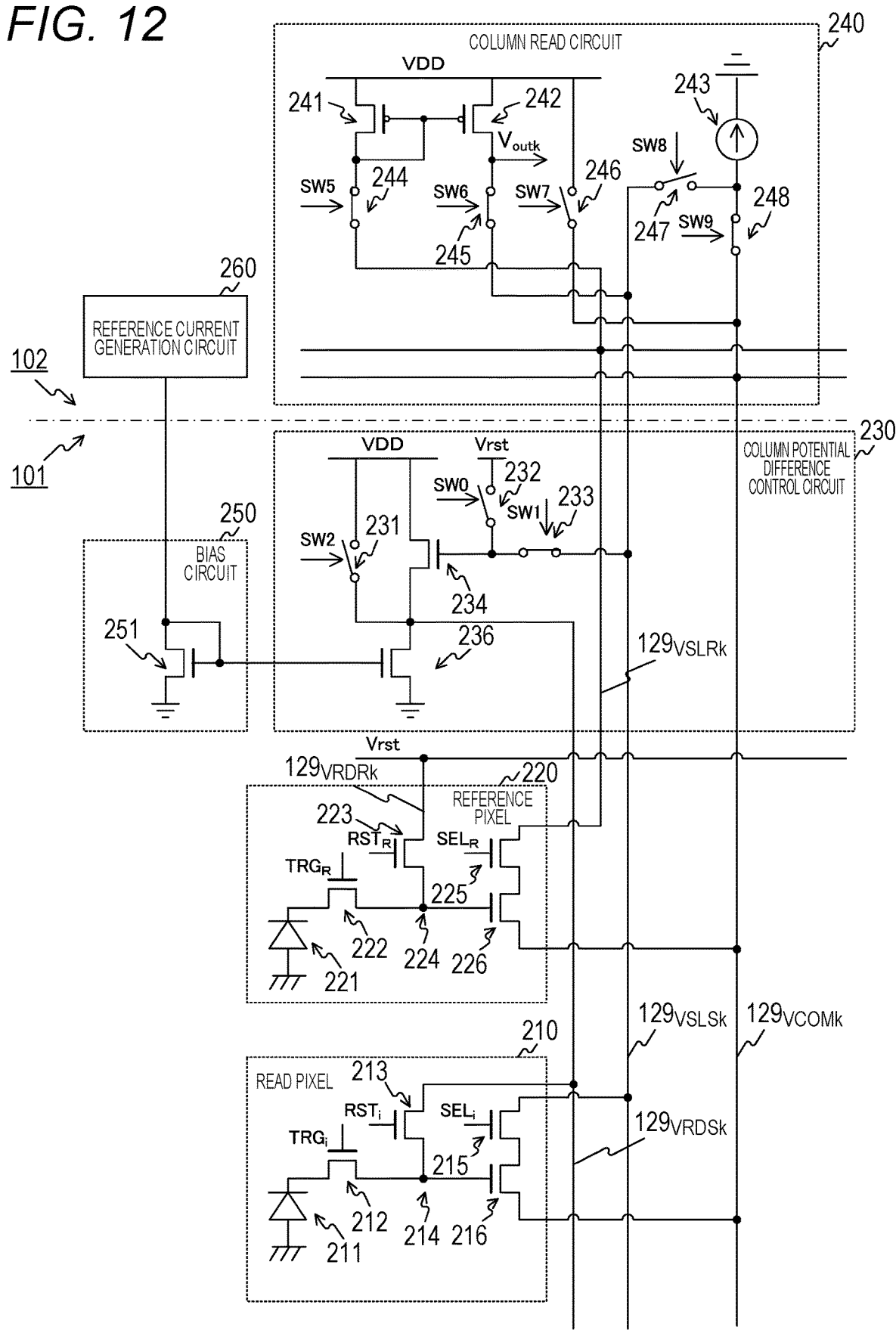
FIG. 12 is a circuit diagram illustrating a configuration example of the CMOS image sensor according to the second embodiment of the present technology.

FIG. 12 is a circuit diagram illustrating a configuration example of the CMOS image sensor 100 according to the second embodiment of the present technology. In the second embodiment, a column potential difference control circuit 230 includes an nMOS transistor 236 as a current source. Furthermore, the CMOS image sensor 100 of the second embodiment further includes a reference voltage generation circuit 260 and a bias circuit 250.

The reference voltage generation circuit 260 generates a predetermined reference current and supplies the same to the bias circuit 250. The bias circuit 250 supplies a bias voltage corresponding to the reference current to a gate of the nMOS transistor 236. The bias circuit 250 includes an nMOS transistor 251 that forms a current mirror circuit with the nMOS transistor 236.

Each pixel (a read pixel 210 and a reference pixel 220) in a pixel array unit 120, the column potential difference control circuit 230 for each column, and the bias circuit 250 are arranged on the light reception chip 101, for example. The remaining circuits (such as the reference voltage generation circuit 260) are arranged on the circuit chip 102.

As illustrated in the drawing, by arranging the circuits in a distributed manner on the stacked light reception chip 101 and circuit chip 102, the area of the pixel array unit 120 increases as compared with a case where the circuits are arranged on the single semiconductor chip.

In this manner, according to the second embodiment of the present technology, the circuits are arranged in a distributed manner on the stacked light reception chip 101 and circuit chip 102, so that it is possible to make the area of the pixel array unit 120 larger than that in a case of arranging them on the single semiconductor chip.

[Variation]

In the second embodiment described above, the column potential difference control circuit 230 and the bias circuit 250 are arranged on the light reception chip 101, but with this configuration, it is difficult to further increase the area of the pixel array unit 120. A CMOS image sensor 100 of a variation of the second embodiment is different from that of the second embodiment in that a column potential difference control circuit 230 and a bias circuit 250 are arranged on a circuit chip 102.

Figure 13:
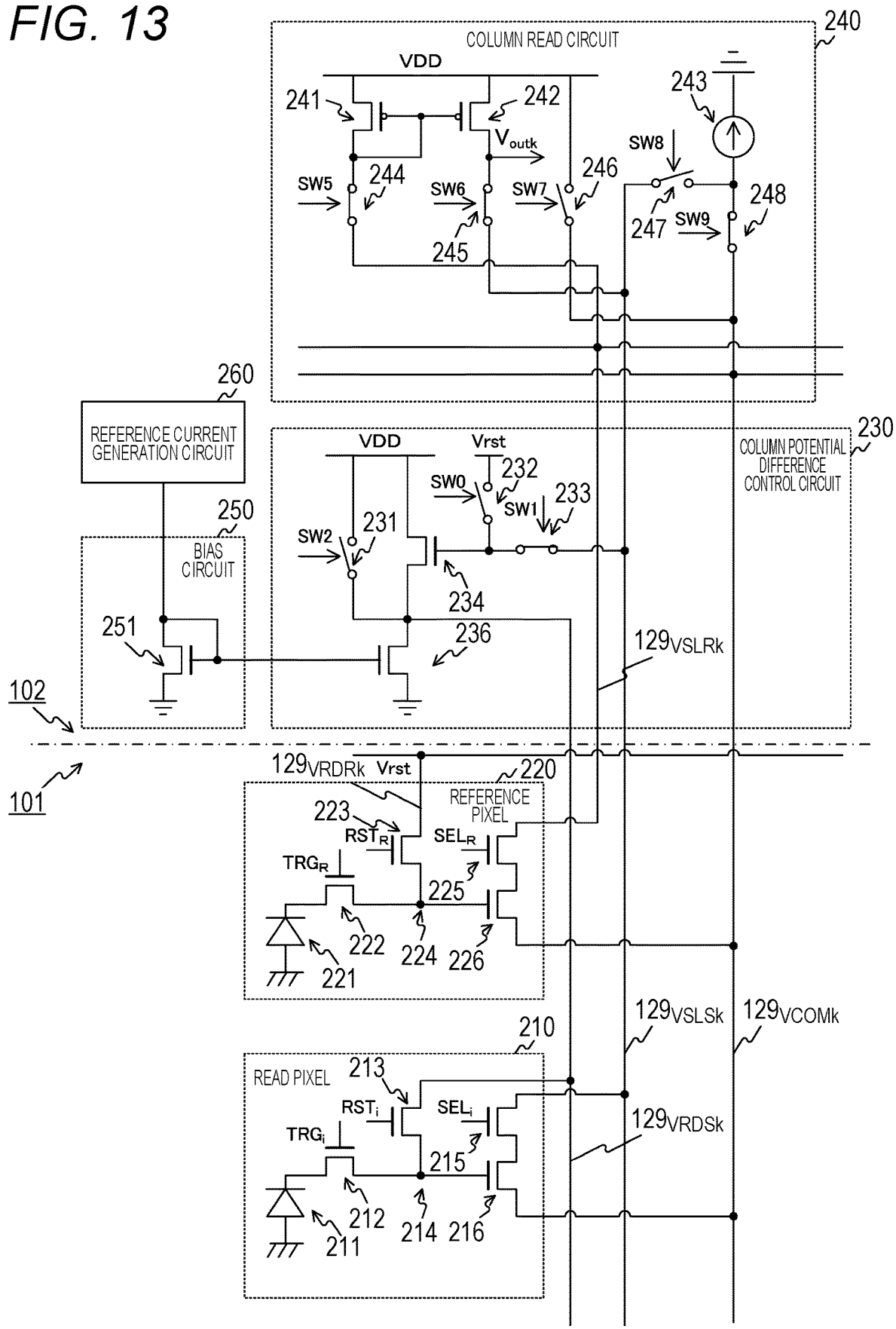
FIG. 13 is a circuit diagram illustrating a configuration example of a CMOS image sensor according to a variation of the second embodiment of the present technology.

FIG. 13 is a circuit diagram illustrating a configuration example of the CMOS image sensor 100 according to the second embodiment of the present technology. The CMOS image sensor 100 of the variation of the second embodiment is different from that of the second embodiment in that the column potential difference control circuit 230 and the bias circuit 250 are arranged on the circuit chip 102. Therefore, the column potential difference control circuit 230 and the bias circuit 250 are removed from the light reception chip 101, and the area of the pixel array unit 120 may be increased accordingly.

In this manner, according to the variation of the second embodiment of the present technology, the column potential difference control circuit 230 and the bias circuit 250 are arranged on the circuit chip 102, so that it is possible to remove the circuits from the light reception chip 101 and increase the area of the pixel array unit 120.

3. Third Embodiment

In the first embodiment described above, the nMOS transistor 234 (that is, the source follower circuit) the drain of which is connected to the power supply voltage VDD generates the potential difference. However, a circuit other than the source follower circuit may be used as long as this may generate the potential difference. A CMOS image sensor 100 of a third embodiment is different from that of the first embodiment in that an nMOS transistor 234 that is diode-connected generates the potential difference.

Figure 14:
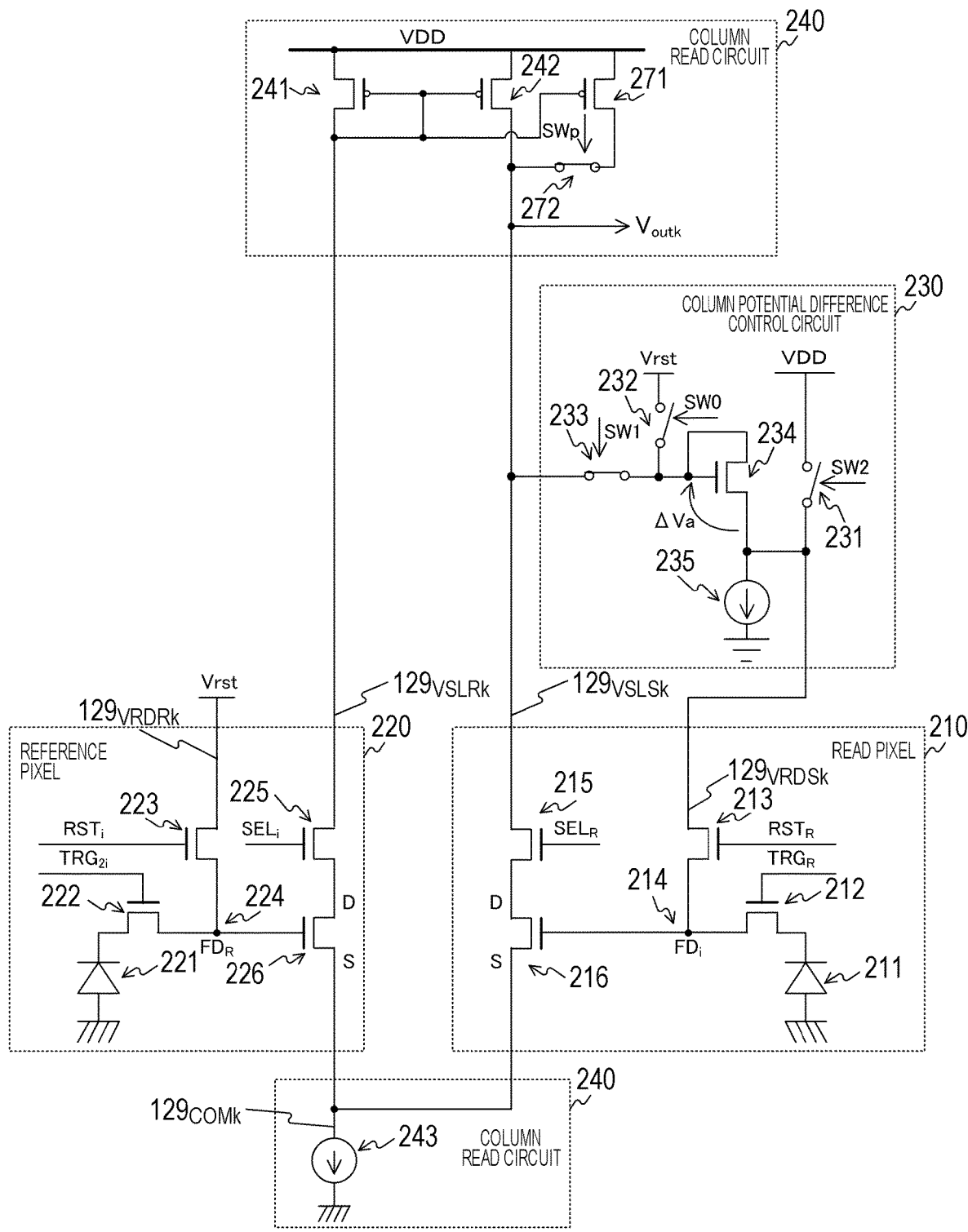
FIG. 14 is a simplified diagram of a differential amplifier circuit according to a third embodiment of the present technology.

FIG. 14 is a simplified diagram of a differential amplifier circuit according to the third embodiment of the present technology. The differential amplifier circuit of the third embodiment is different from that of the first embodiment in that a drain of the nMOS transistor 234 in a column potential difference control circuit 230 is connected (that is, diode-connected) to a gate.

Furthermore, a column read circuit 240 of the third embodiment further includes a pMOS transistor 271 and a switch 272.

A source of the pMOS transistor 271 is connected to the power supply voltage VDD, and a gate thereof is connected to a gate and a drain of a pMOS transistor 241.

The switch 272 opens and closes a path between a drain of the pMOS transistor 271 and a read-side vertical signal line $129_{VSLSk}$ according to a control signal SWp from a system control unit 130.

The system control unit 130 puts the switch 272 into a closed state by the control signal SWp at the time of initialization. Therefore, the number of parallel transistors in a current mirror circuit including the pMOS transistors 241, 242, and 271 may be increased.

Figure 15:
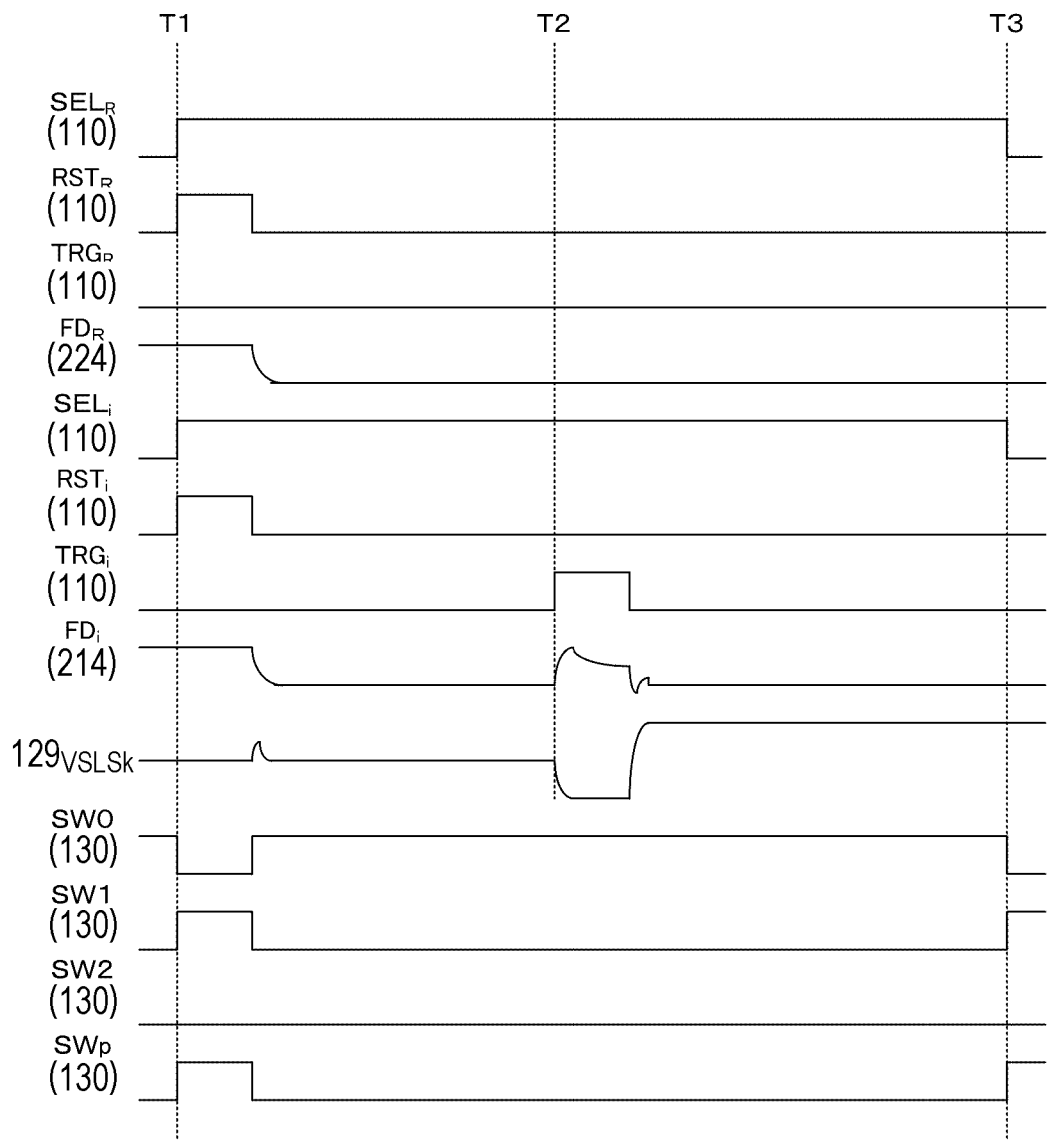
FIG. 15 is a timing chart illustrating an example of an operation of a CMOS image sensor in a differential mode according to the third embodiment of the present technology.

FIG. 15 is a timing chart illustrating an example of an operation of the CMOS image sensor 100 in a differential mode according to the third embodiment of the present technology. The control signal SWp is set to a high level when the corresponding switch 272 is put into a closed (on) state, and set to a low level when this is put into an open (off) state.

The system control unit 130 sets the control signal SWp to the high level over a pulse period from timing t1, that is, when a floating diffusion layer is initialized.

Note that, the second embodiment and the variation of the second embodiment may also be applied to the third embodiment.

In this manner, according to the third embodiment of the present technology, since the diode-connected nMOS transistor 234 generates the potential difference, the amplification transistor 216 may be operated in a saturated region. Therefore, a variation in gain of the amplification transistor 216 is reduced, and an image quality of image data may be improved.

[Variation]

In the third embodiment described above, the diode-connected nMOS transistor 234 generates the potential difference, but an element other than the transistor may also be used as long as this may generate the potential difference. A CMOS image sensor 100 of a variation of the third embodiment is different from that of the third embodiment in that a resistance element generates the potential difference.

Figure 16:
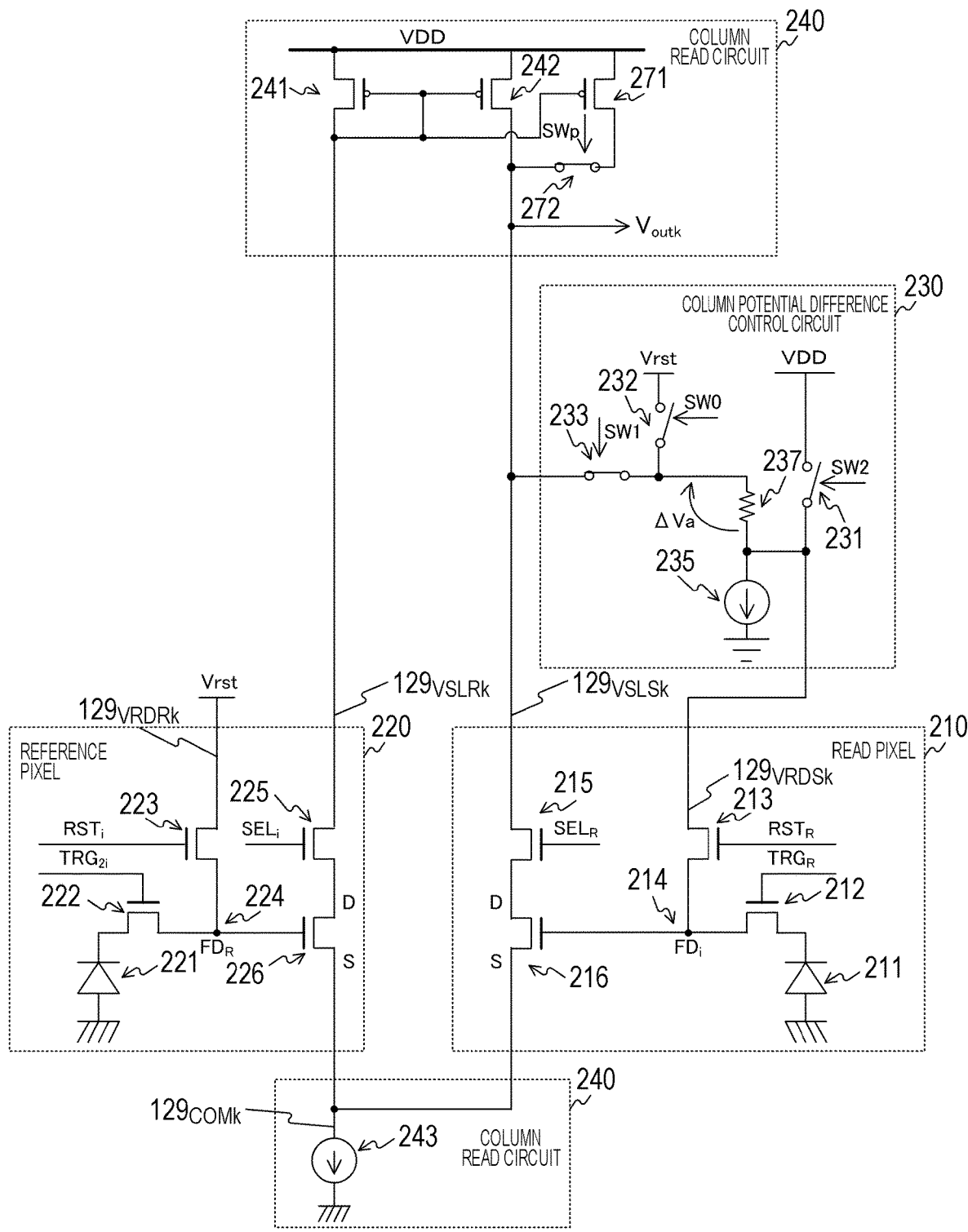
FIG. 16 is a simplified diagram of a differential amplifier circuit according to a variation of the third embodiment of the present technology.

FIG. 16 is a simplified diagram of a differential amplifier circuit according to the variation of the third embodiment of the present technology. A differential amplifier circuit of the variation of the third embodiment is different from that of the third embodiment in including a resistance element 237 in place of an nMOS transistor 234.

A potential difference ΔVa may be generated by allowing a current generated by a current source 235 to flow through the resistance element 237. A method of controlling a control signal SWp of the variation of the third embodiment of the present technology is similar to that of the third embodiment.

Note that, the second embodiment and the variation of the second embodiment may also be applied to the variation of the third embodiment.

In this manner, according to the variation of the third embodiment of the present technology, since the resistance element 237 generates the potential difference, the amplification transistor 216 may be operated in a saturated region. Therefore, a variation in gain of the amplification transistor 216 is reduced, and an image quality of image data may be improved.

4. Fourth Embodiment

In the first embodiment described above, one column potential difference control circuit 230 is arranged for each column, but the potential difference ΔVa generated by the column potential difference control circuit 230 might vary, and the fixed pattern noise might increase. A CMOS image sensor 100 of the fourth embodiment is different from that of the first embodiment in that a fixed pattern noise is reduced by arranging N (N is an integer of two or larger) column potential difference control circuits for each column and switching them.

Figure 17:
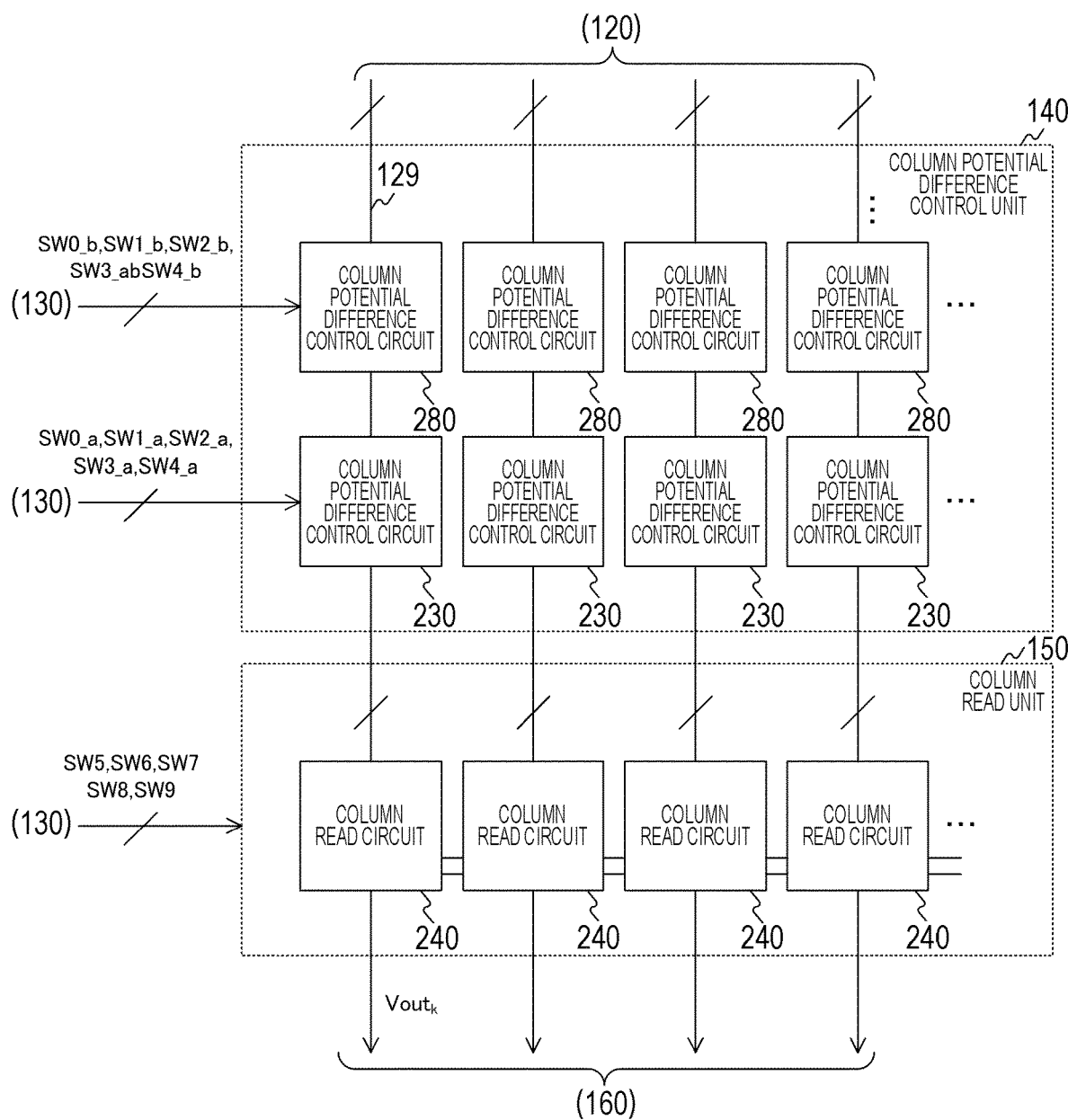
FIG. 17 is a block diagram illustrating a configuration example of a column potential difference control unit and a column read unit according to a fourth embodiment of the present technology.

FIG. 17 is a block diagram illustrating a configuration example of a column potential difference control unit 140 and a column read unit 150 according to the fourth embodiment of the present technology. The column potential difference control unit 140 of the fourth embodiment is different from that of the first embodiment in that the N column potential difference control circuits such as column potential difference control circuits 230 and 280 are arranged for each column. When the number of columns is K, the column potential difference control circuits of N rows×K columns are arrayed.

Figure 18:
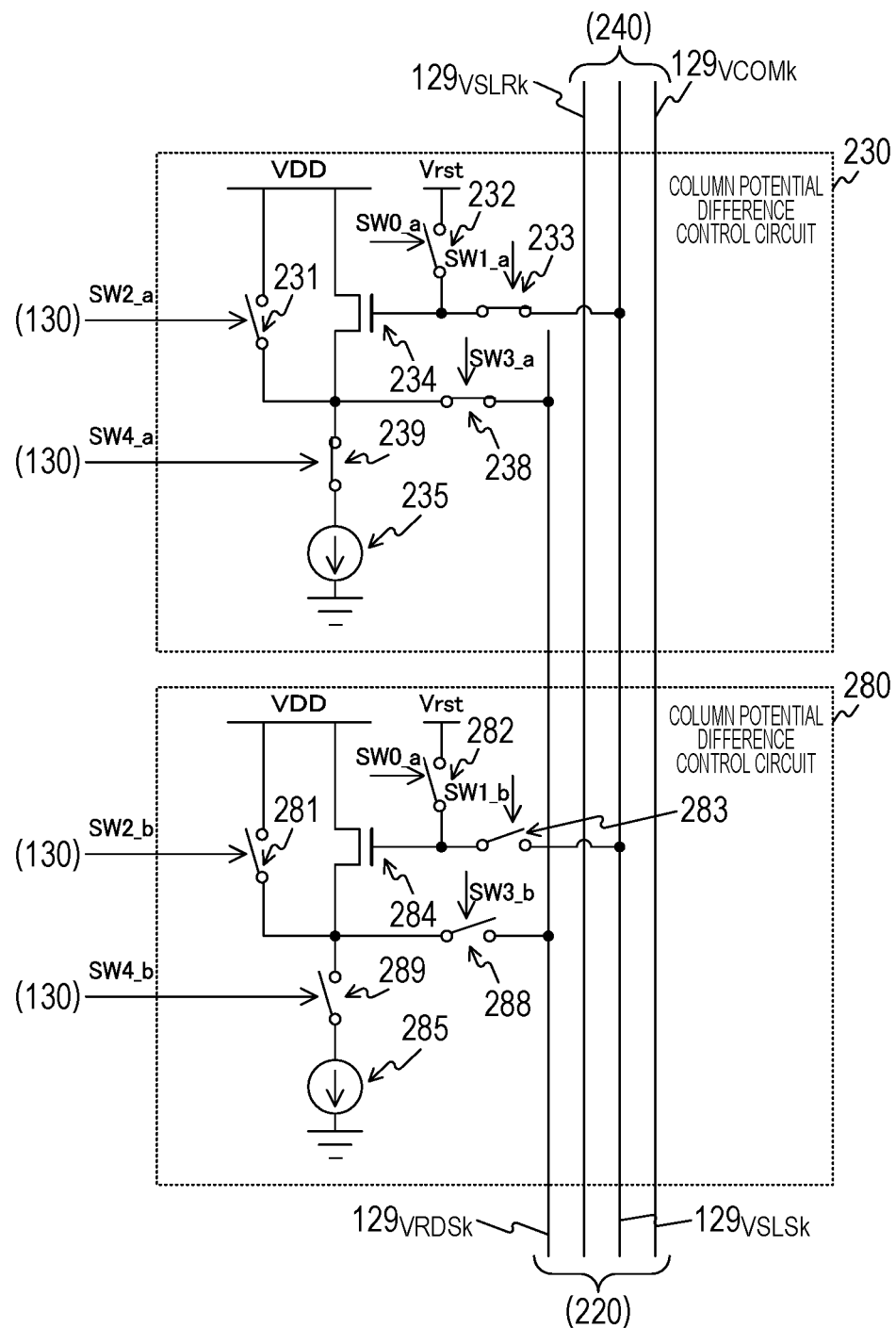
FIG. 18 is a circuit diagram illustrating a configuration example of a column potential difference control circuit according to the fourth embodiment of the present technology.

FIG. 18 is a circuit diagram illustrating a configuration example of the column potential difference control circuits 230 and 280 according to the fourth embodiment of the present technology. The column potential difference control circuit 230 of the fourth embodiment is different from that of the first embodiment in further including switches 238 and 239.

Furthermore, control signals SW2_a, SW0_a, and SW1_a are supplied to the switches 231, 232, and 233, respectively.

The switch 238 opens and closes a path between a connection node of the nMOS transistor 234 and the switch 239, and a read-side vertical reset input line $129_{VRDSk}$ according to a control signal SW3_a from a system control unit 130.

The switch 239 opens and closes a path between a source of the nMOS transistor 234 and a current source 235 according to a control signal SW4_a from the system control unit 130.

The column potential difference control circuit 280 includes switches 281 to 283, an nMOS transistor 284, a current source 285, and switches 288 and 289. A connection configuration of elements in the column potential difference control circuit 280 is similar to that of the column potential difference control circuit 230. Control signals SW0_b to SW4_b are supplied to the column potential difference control circuit 280.

With the above-described configuration, the system control unit 130 may select and drive any one of the column potential difference control circuits (such as the column potential difference control circuits 230 and 280) of N rows. For example, in a case where the column potential difference control circuit 230 is selected, the system control unit 130 puts both the switches 238 and 239 into a closed state by the control signal SW3_b and the control signal SW4_b, respectively. In contrast, in a case where the column potential difference control circuit 230 is not selected, the system control unit 130 puts both the switches 238 and 239 into an open state.

Figure 19:
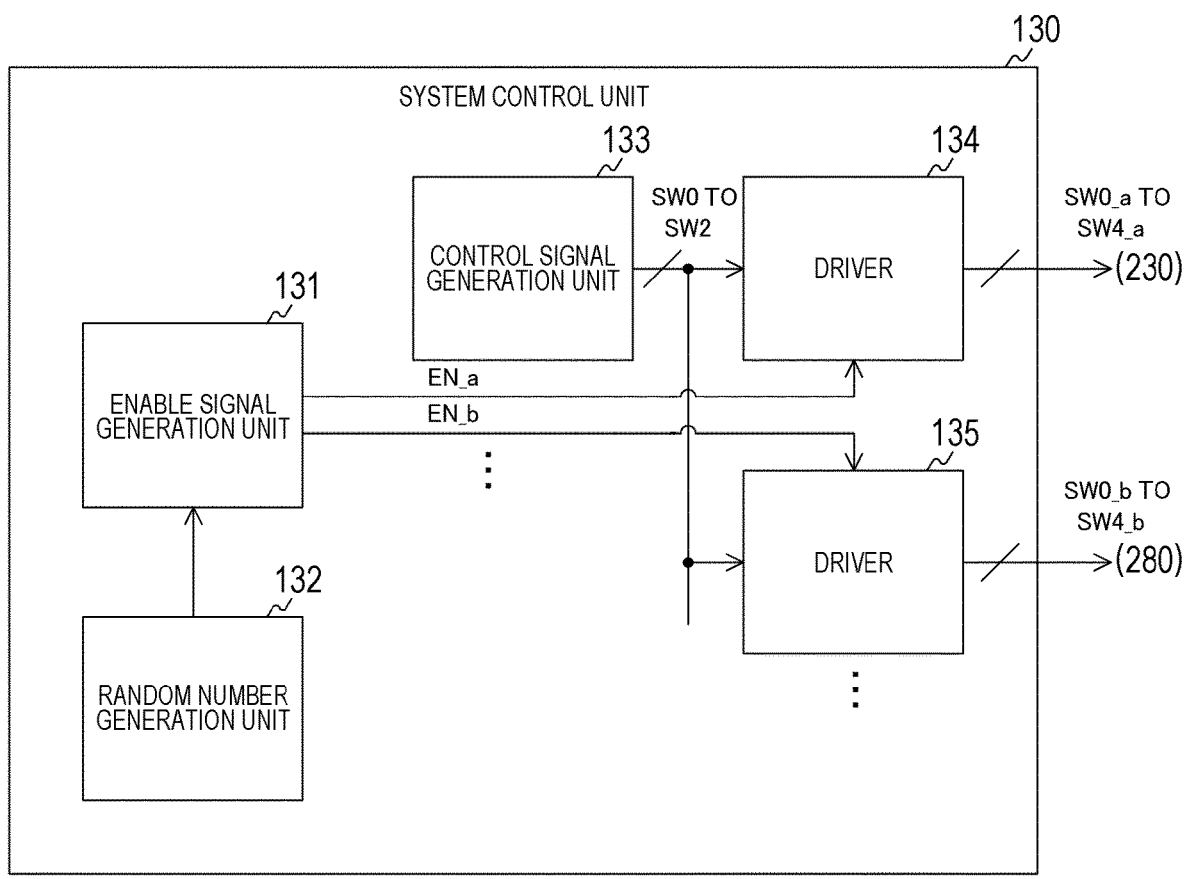
FIG. 19 is a block diagram illustrating a configuration example of a system control unit according to the fourth embodiment of the present technology.

FIG. 19 is a block diagram illustrating a configuration example of the system control unit 130 according to the fourth embodiment of the present technology. The system control unit 130 of the fourth embodiment includes an enable signal generation unit 131, a random number generation unit 132, a control signal generation unit 133, and N drivers such as drivers 134 and 135. The driver is arranged for each row of the column potential difference control circuit.

The random number generation unit 132 generates a random number by using linear feedback shift register (LFSR) and the like every time a row to be read is selected by a vertical drive unit 110. The random number generation unit 132 supplies the generated random number to the enable signal generation unit 131.

The enable signal generation unit 131 generates an enable signal on the basis of the random number. The enable signal generation unit 131 generates N enable signals such as enable signals EN_a and EN_b. The enable signal is generated for each driver and supplied to the corresponding driver. The enable signal generation unit 131 sets any of a plurality of drivers to be enabled and sets the rest to be disabled on the basis of the random number.

The control signal generation unit 133 generates the control signals SW0 to SW2 and supplies them to each driver such as the drivers 134 and 135.

The driver 134 drives the column potential difference control circuit 230. In a case where the driver 134 is set to be enabled by the enable signal EN_a, this directly outputs the control signals SW0 to SW2 from the control signal generation unit 133 to the column potential difference control circuit 230 as SW0_$a$ to SW2_$a$. Furthermore, in a case where the driver 134 is set to be enabled, this outputs SW3_$a$ and SW4_$a$ for putting the corresponding switches into a closed state to the column potential difference control circuit 230. In contrast, in a case where the driver 134 is set to be disabled, this outputs the control signals SW0_$a$ to SW4_$a$ for putting the corresponding switches into an opened state to the column potential difference control circuit 230.

The driver 135 drives the column potential difference control circuit 280. A configuration of the driver 135 is similar to that of the driver 134. Note that, the driver 135 outputs the control signals SW0_$b$ to SW4_$b$.

With the configuration described above, the system control unit 130 may randomly select any one of the column potential difference control circuits of N rows every time the row to be read is selected. Therefore, it is possible to improve a column fixed pattern noise by dispersing a fixed variation in a column direction.

Figure 20:
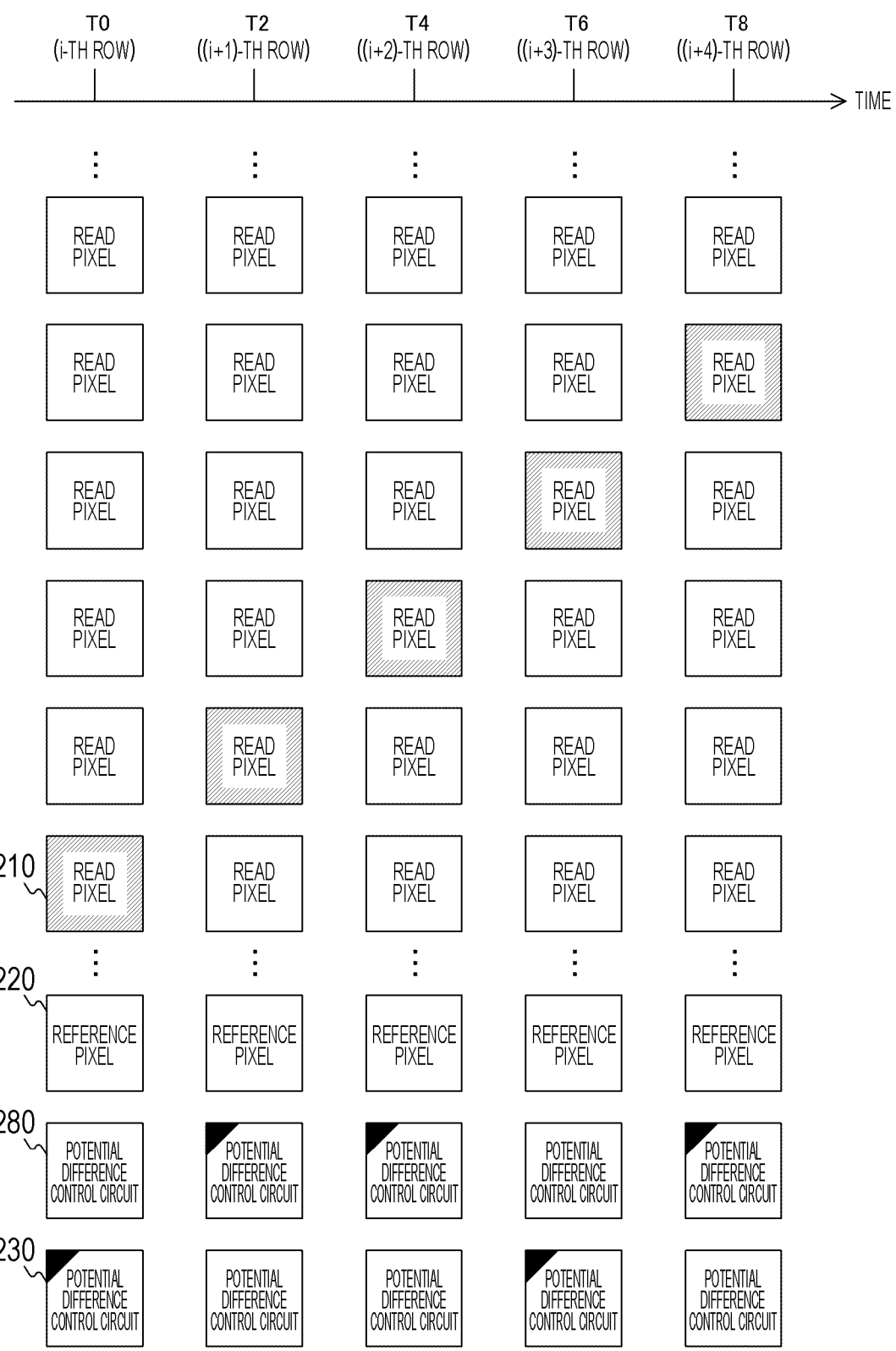
FIG. 20 is a diagram for illustrating an operation of a CMOS image sensor in a differential mode according to the fourth embodiment of the present technology.

FIG. 20 is a diagram for illustrating an operation of the CMOS image sensor in a differential mode according to the fourth embodiment of the present technology. In the drawing, time is plotted along the abscissa indicating access to a certain column for each period of a horizontal synchronization signal. Here, the horizontal synchronization signal is a periodic signal indicating a timing at which each row of the read pixels 210 is read. A hatched pixel indicates a read pixel 210 driven by the vertical drive unit 110. A circuit with a black triangle on an upper left corner indicates a column potential difference control circuit 130 driven by the system control unit 130.

The read pixels 210 are sequentially read as in conventional rolling reading. The reference pixel 220 of a dedicated fixed reference pixel row is always accessed. The system control unit 130 randomly switches the row of the column potential difference control circuit every time the period of the horizontal synchronization signal elapses (in other words, every time the row of the read pixels 210 is selected).

For example, an i-th row is read at timing T0, and the row of the column potential difference control circuit 280 is selected. An (i+1)-th row is read at timing T2, and the row of the column potential difference control circuit 230 is selected.

Since selection of the column potential difference control circuit has randomness without any correlation with a pixel access row, the column potential difference control circuit to be used is random even when focusing on the same pixel in each frame. Therefore, a variation in potential difference $\Delta Va$ may be shifted not to a fixed component but to a random component. In general, the fixed component is more remarkable in a captured image, so that improvement in image quality may be expected.

Figure 21:
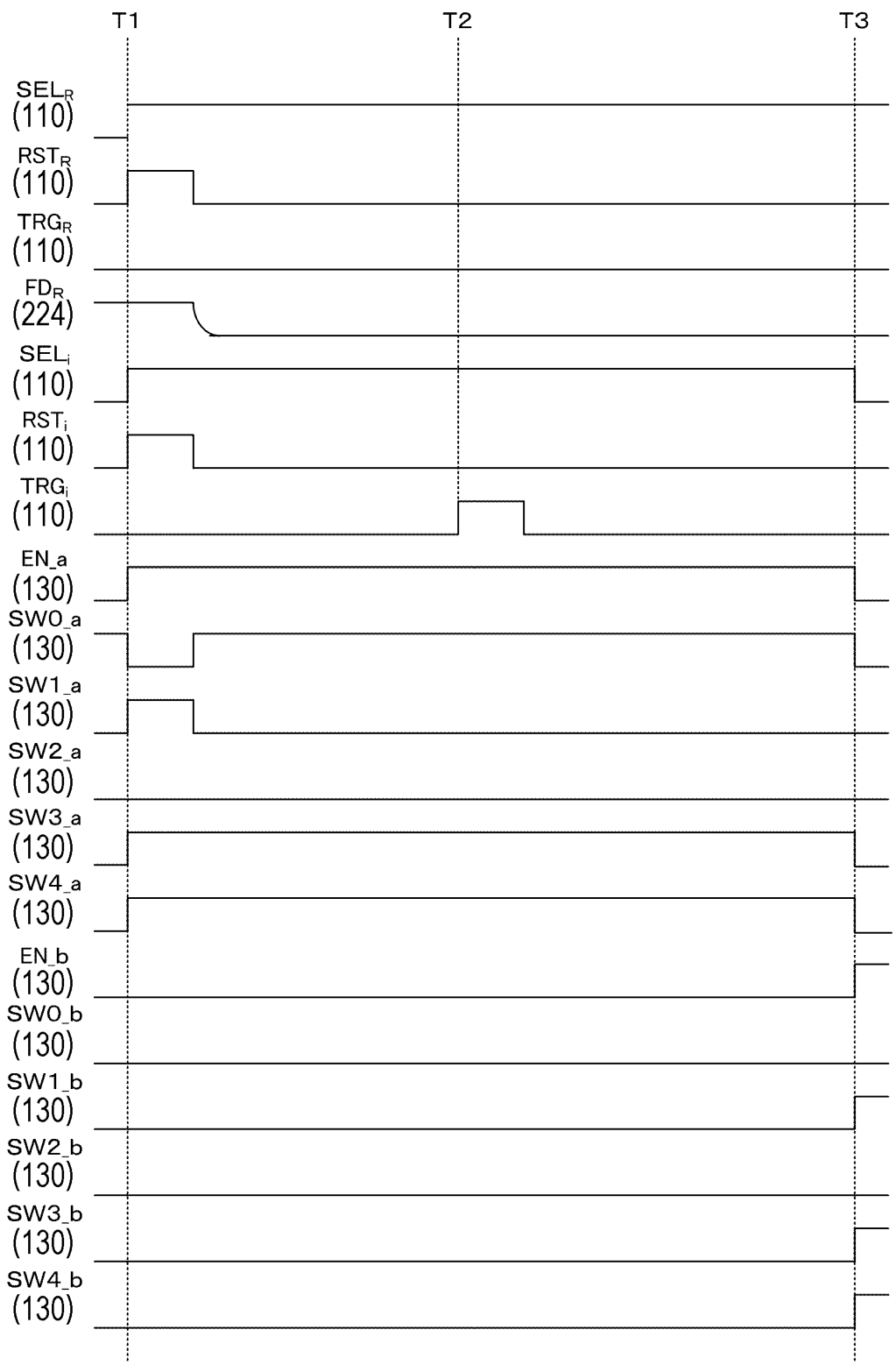
FIG. 21 is a timing chart illustrating an example of an operation of the CMOS image sensor in the differential mode according to the fourth embodiment of the present technology.

FIG. 21 is a timing chart illustrating an example of an operation of the CMOS image sensor in the differential mode according to the fourth embodiment of the present technology. Suppose that the i-th row is selected as a read target at timing T0 in a state where the differential mode is set, and the row of the column potential difference control circuit 230 is selected on the basis of the random number. The control signals such as the control signals SW3_$a$ and SW4_$a$ are set to a high level when the corresponding switch is put into a closed state.

The system control unit 130 supplies the control signals SW0_$a$ to SW2_$a$ similar to the control signals SW0 to SW2 of the first embodiment to the column potential difference control circuit 230. Furthermore, the control signals SW3_$a$ and SW4_$a$ are set to the high level.

In contrast, the system control unit 130 sets all the control signals (control signals SW0_$b$ to SW4_$b$ and the like) corresponding to the unselected column potential difference control circuits to a low level.

Figure 22:
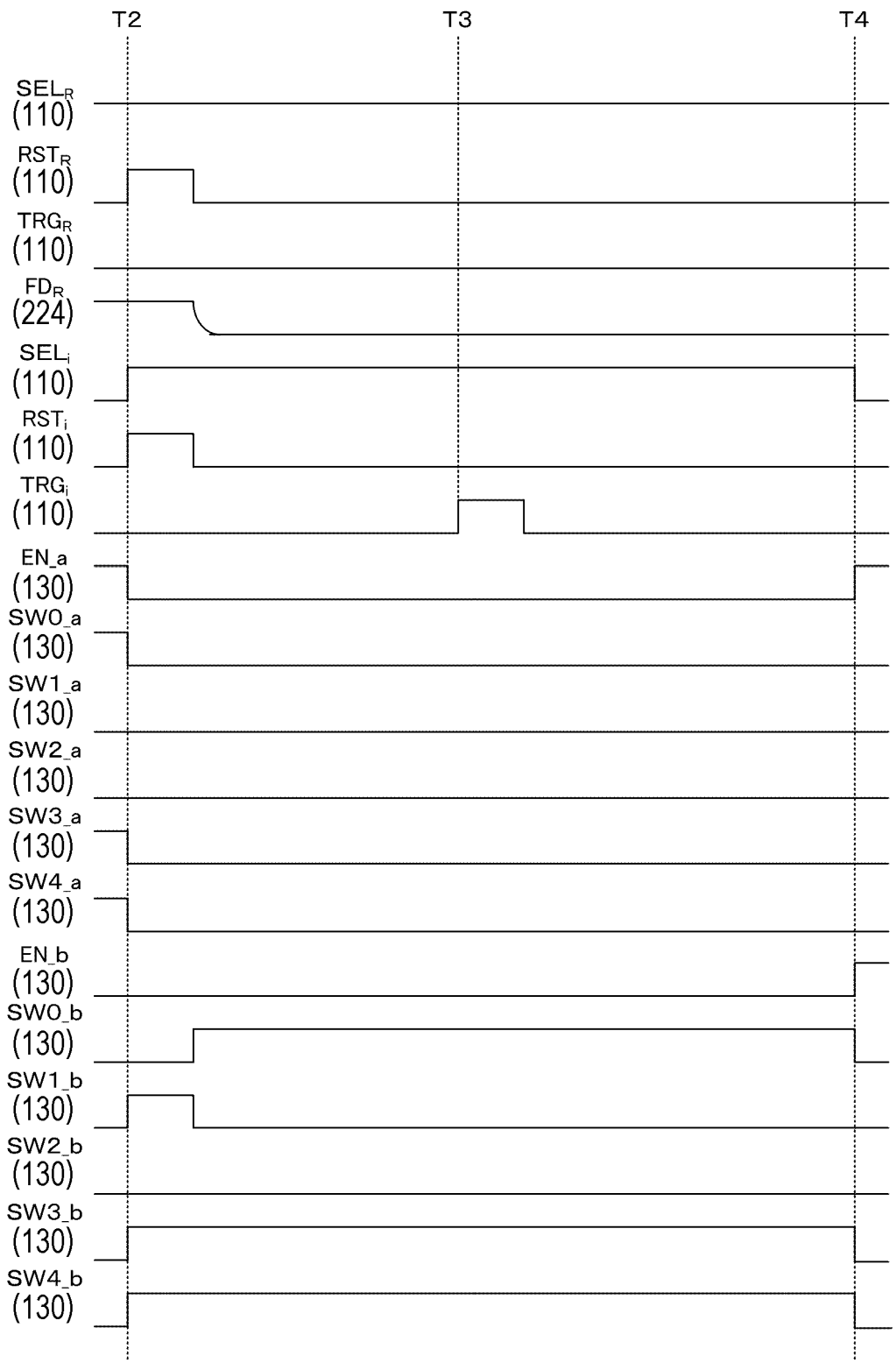
FIG. 22 is a timing chart illustrating an example of an operation in the differential mode when the column potential difference control circuit is switched according to the fourth embodiment of the present technology.

FIG. 22 is a timing chart illustrating an example of an operation in the differential mode when the column potential difference control circuit is switched according to the fourth embodiment of the present technology. Suppose that the (i+1)-th row is selected as a read target at timing T2, and the row of the column potential difference control circuit 280 is selected on the basis of the random number.

The system control unit 130 supplies the control signals SW0_$b$ to SW2_$b$ similar to the control signals SW0 to SW2 of the first embodiment to the column potential difference control circuit 280. Furthermore, the control signals SW3_$b$ and SW4_$b$ are set to a high level.

In contrast, the system control unit 130 sets all the control signals (control signals SW0_$a$ to SW4_$a$ and the like) corresponding to the unselected column potential difference control circuits to a low level.

Note that, the second and third embodiments and the variations thereof may also be applied to the fourth embodiment.

In this manner, according to the fourth embodiment of the present technology, since the column potential difference control circuits of the N rows are randomly switched for each column, it is possible to disperse a variation in potential difference in the column direction and reduce column fixed pattern noise.

[Variation]

In the fourth embodiment described above, the column potential difference control circuits of N rows are randomly switched every time the row to be read is selected by the vertical drive unit 110; however, as the number of rows increases, the number of times of generation of random numbers for each frame increases, and power consumption increases. The CMOS image sensor 100 of a variation of the fourth embodiment is different from that of the fourth embodiment in that the column potential difference control circuit is switched for each frame.

Figure 23:
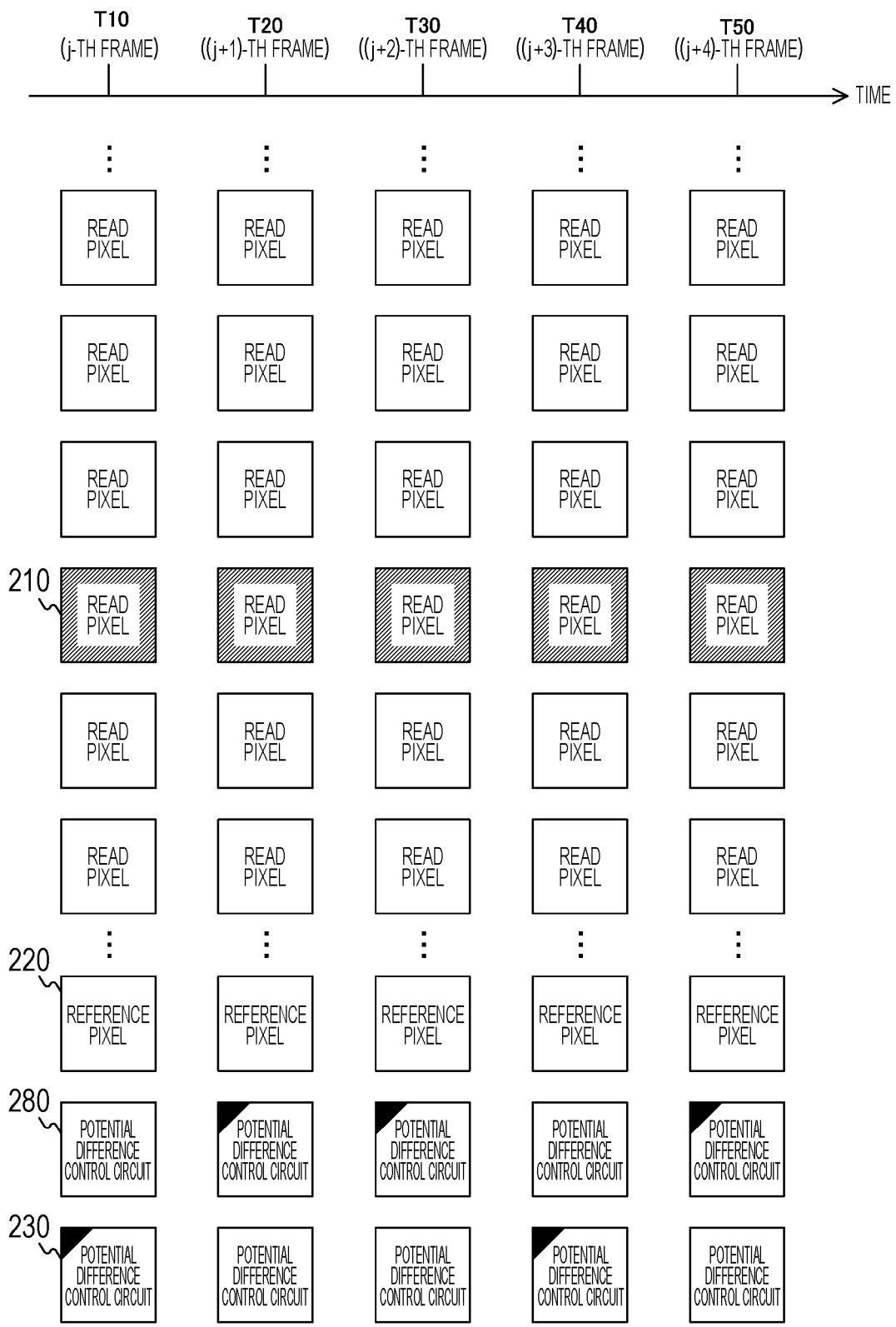
FIG. 23 is a diagram for illustrating an operation of a CMOS image sensor in a differential mode according to a variation of the fourth embodiment of the present technology.

FIG. 23 is a diagram for illustrating an operation of the CMOS image sensor in a differential mode according to the variation of the fourth embodiment of the present technology. A system control unit of the variation of the fourth embodiment generates a random number and switches the column potential difference control circuit every time a period of a vertical synchronization signal elapses (in other words, all the rows in the frame are read).

For example, an i-th frame is read at timing T10, and a row of a column potential difference control circuit 280 is selected. An (i+1)-th is read at timing T20, and a row of a column potential difference control circuit 230 is selected. As illustrated in the drawing, the column potential difference control circuit is randomly switched for each frame also for the pixel of the same coordinates.

Note that, the second and third embodiments and the variations thereof may also be applied to the variation of the fourth embodiment.

In this manner, according to the variation of the fourth embodiment of the present technology, since the column potential difference control circuit is randomly switched every time the frame is read, the number of times of random number generation per unit time may be reduced.

5. Fifth Embodiment

In the first embodiment described above, the column read circuit 240 outputs the pixel signal from the read-side vertical signal line $129_{VSLSk}$; however, in this configuration, it is difficult to further shorten a settling time. The column read circuit 240 of the fifth embodiment is different from that of the first embodiment in that a settling time is shortened by outputting a pixel signal from a read-side vertical reset input line $129_{VRDSk}$.

Figure 24:
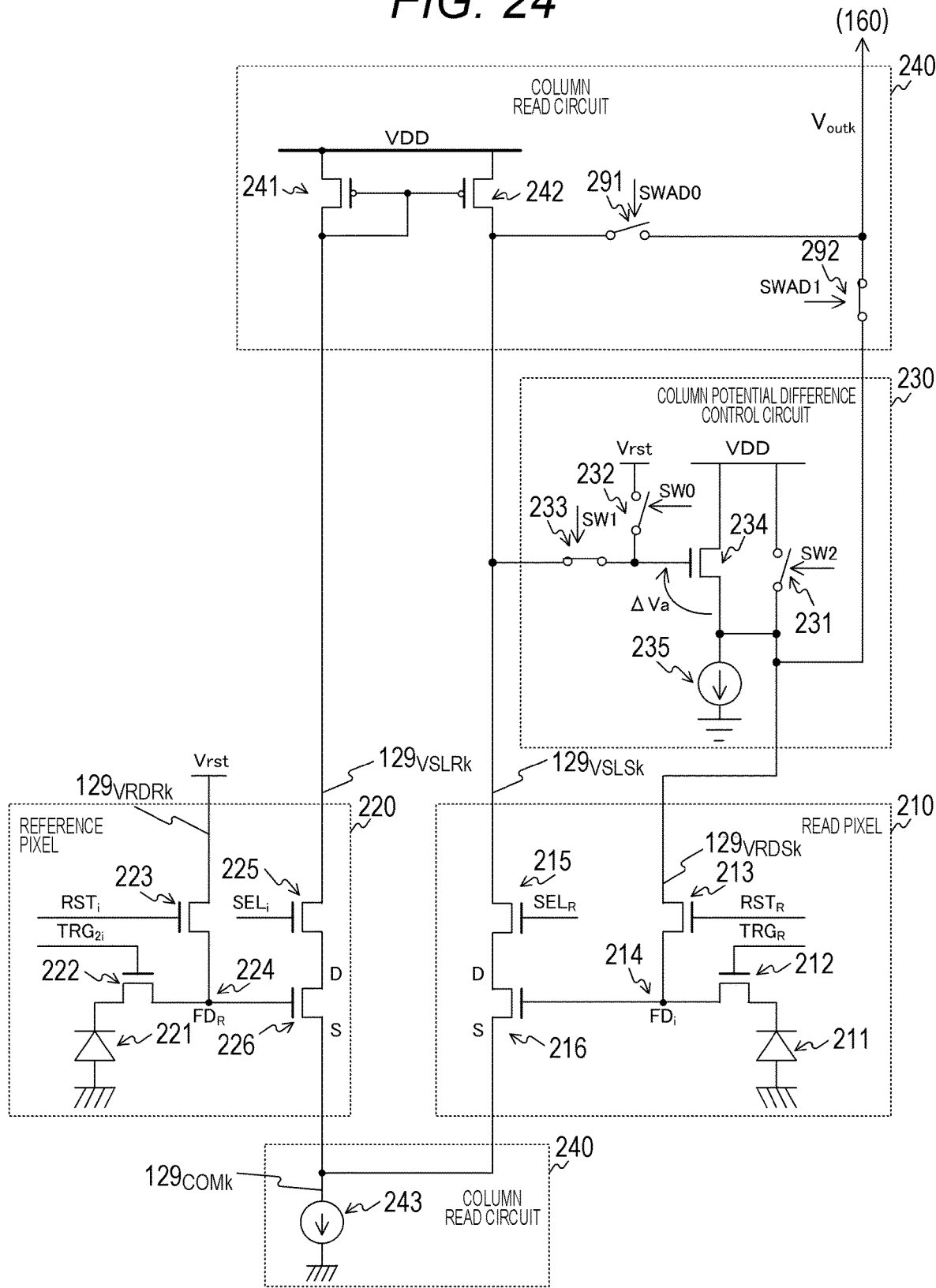
FIG. 24 is a simplified diagram of a differential amplifier circuit according to a fifth embodiment of the present technology.

FIG. 24 is a simplified diagram of a differential amplifier circuit according to the fifth embodiment of the present technology. The column read circuit 240 of the fifth embodiment is different from that of the first embodiment in further including switches 291 and 292.

The switch 291 opens and closes a path between a read-side vertical signal line $129_{VSLSk}$ and an ADC (not illustrated) in a column signal processing unit 160 according to a control signal SWAD0 from a system control unit 130. Note that, the switch 291 is an example of a first switch recited in claims.

The switch 292 opens and closes a path between the read-side vertical reset input line $129_{VRDSk}$ and the ADC (not illustrated) in the column signal processing unit 160 according to a control signal SWAD1 from the system control unit 130. Note that, the switch 291 is an example of a second switch recited in claims.

With the above-described configuration, the system control unit 130 may put the switch 292 into an on state by the control signal SWAD1 as necessary, and output a pixel signal (reset level and signal level) from the read-side vertical reset input line $129_{VRDSk}$. At that time, the switch 291 is controlled to be in an off state by a control signal SWAD2. A source follower circuit used for generating a potential difference when resetting a differential amplifier is used as a buffer amplifier having a gain of about one time when reading the pixel signal.

By outputting the pixel signal (the reset level and the signal level) from the read-side vertical reset input line $129_{VRDSk}$, the settling time may be shortened with respect to a case of outputting the same from the read-side vertical signal line $129_{VSLSk}$. However, since there is no advantage in an SF mode, it is desirable that the system control unit 130 puts the switch 291 into a closed state and puts the switch 292 into an open state.

Note that, the second to fourth embodiments and the variations thereof may also be applied to the fifth embodiment.

In this manner, according to the fifth embodiment of the present technology, the column read circuit 240 outputs the pixel signal from the read-side vertical reset input line $129_{VRDSk}$, the settling time may be shortened.

6. Sixth Embodiment

In the first embodiment described above, the amplification transistor 216 amplifies the signal of the voltage of the floating diffusion layer 214; however, it is desirable to further reduce noise generated in the amplification transistor 216. A CMOS image sensor 100 of a sixth embodiment is different from that of the first embodiment in that an amplification transistor 216 has a FinFET structure and noise is reduced.

Figure 25:
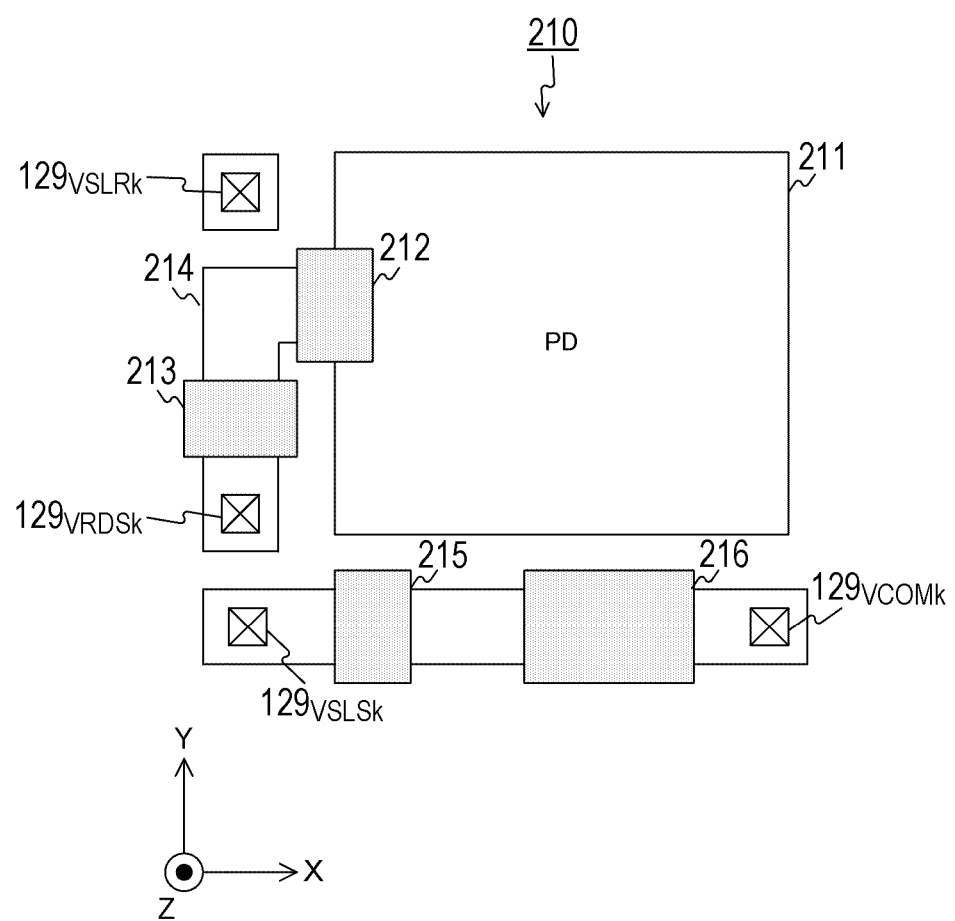
FIG. 25 is a plan view illustrating a layout example of an element in a read pixel according to a sixth embodiment of the present technology.

FIG. 25 is a plan view illustrating a layout example of an element in a read pixel 210 according to the sixth embodiment of the present technology. An axis perpendicular to a light-receiving surface of a pixel array unit 120 is set as a Z-axis, and a predetermined axis parallel to the light-receiving surface is set as an X-axis. An axis perpendicular to the X-axis and the Z-axis is set as a Y-axis.

A photoelectric conversion element 211, a transfer transistor 212, a reset transistor 213, a floating diffusion layer 214, a selection transistor 215, and an amplification transistor 216 described above are arranged in the read pixel 210. Furthermore, a read-side vertical reset input line $129_{VRDSk}$, a read-side vertical signal line $129_{VSLSk}$, and a vertical current supply line $129_{VCOMk}$ are wired in a Z-axis direction.

Furthermore, a drain and a source of the amplification transistor 216 are arrayed in an X-axis direction.

Note that, a layout of a reference pixel 220 is similar to that of the read pixel 210.

Figure 26C:
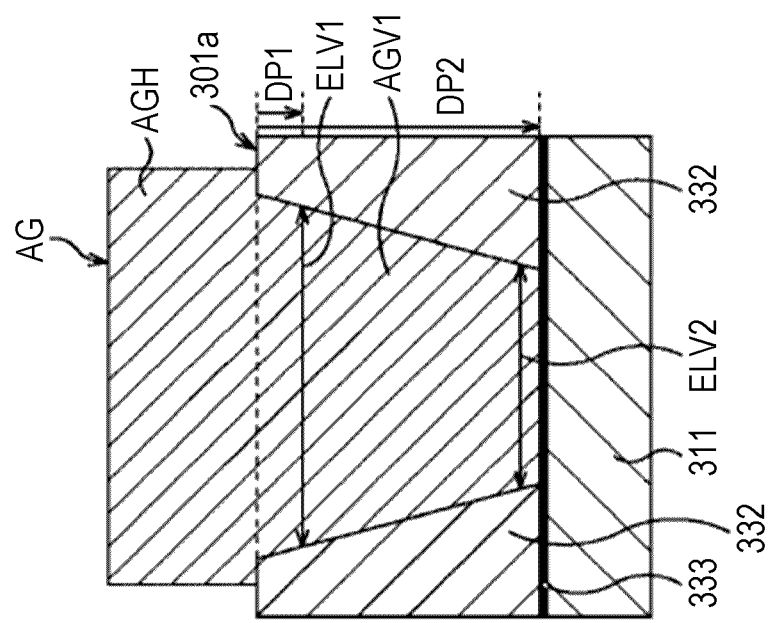
FIGS. 26A, 26B, and 26C are views illustrating a first configuration example of an amplification transistor in the sixth embodiment of the present technology.
Figure 26B:
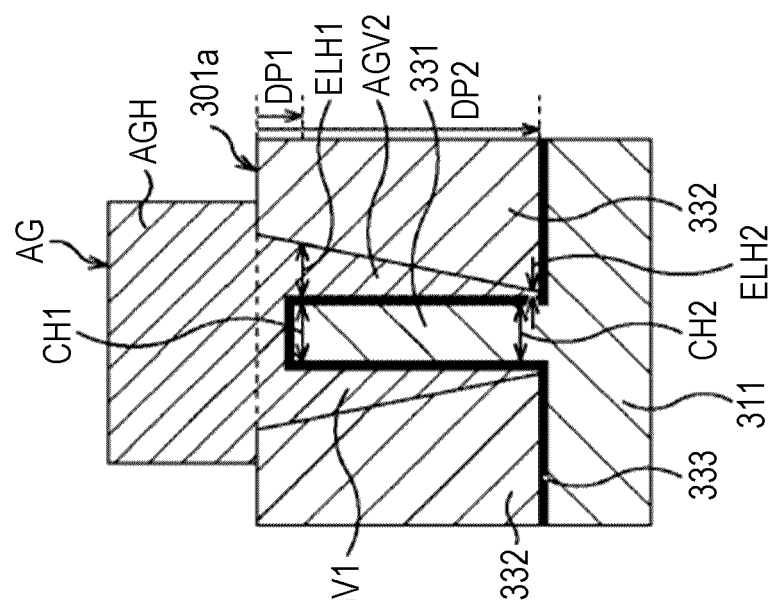
Figure 26A:
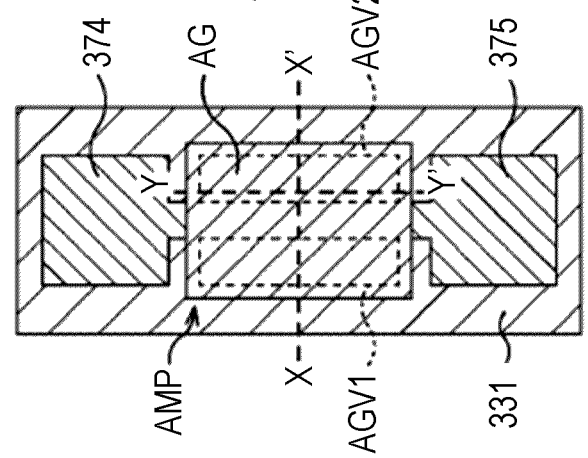

FIGS. 26A, 26B, and 26C illustrate a first configuration example of the amplification transistor 216. In FIGS. 26A, 26B, and 26C, FIG. 26 A is a plan view of the amplification transistor 216, b is a cross-sectional view taken along line X-X' of a, and c is a cross-sectional view taken along line Y-Y' of a.

In a plane view in FIG. 26A, a gate electrode AG of the amplification transistor 216 is arranged between a high-concentration n-type layer 374 as the drain and a high-concentration n-type layer 375 as the source.

As illustrated in FIGS. 26B and 26C, the gate electrode AG of the amplification transistor 216 includes a planar electrode portion AGH above a front surface 301a (substrate surface) of a semiconductor substrate 301, and first and second vertical gate electrode portions AGV1 and AGV2. These gate electrodes are embedded in a depth direction from the substrate surface. In a case where the first vertical gate electrode portion AGV1 and the second vertical gate electrode portion AGV2 are not especially distinguished from each other, they are simply referred to as vertical gate electrode portions AGV.

In a cross-sectional view in FIG. 26B, a fin portion 331 to be a channel region of the amplification transistor 216 is formed using a p-well 311 between the first vertical gate electrode portion AGV1 and the second vertical gate electrode portion AGV2. Note that, in the first configuration example, the fin portion 331 is formed using the p-well 311, but the fin portion 331 is sometimes a region not ion-implanted of the semiconductor substrate.

In the cross-sectional view in FIG. 26B, each of the first and second vertical gate electrode portions AGV1 and AGV2 has a structure in which a second electrode width ELH2 is shorter than a first electrode width ELH1. The first electrode width ELH1 is a width of the vertical gate electrode portion at a first depth DP1 from the front surface 301a, and the second electrode width ELH2 is a width of the gate electrode portion at a second depth DP2 from the front surface 301a. In other words, the first vertical gate electrode portion AGV1 and the second vertical gate electrode portion AGV2 have a reverse tapered shape in which a bottom surface side of the vertical gate electrode portion AGV is narrow in cross-sectional view.

In contrast, as for the fin portion 331 to be the channel region, a first channel width CH1 at the first depth DP1 from the front surface 301a and a second channel width CH2 at the second depth DP2 from the substrate surface are the same or substantially the same. Here, "substantially the same" is intended to mean a range of difference that may be regarded as the same, and includes deviation and the like due to a manufacturing error and the like.

Here, the first depth DP1 is a position of a channel uppermost surface the closest to the front surface 301a of the fin portion 331 between the first vertical gate electrode portion AGV1 and the second vertical gate electrode portion AGV2. The second depth DP2 is a position of a bottom surface of the vertical gate electrode portion AGV the farthest from the front surface 301a of the first vertical gate electrode portion AGV1 and the second vertical gate electrode portion AGV2. Note that, in the drawing, the positions are slightly shifted in order to give priority to visibility.

In a cross-sectional view in FIG. 26C also, each of the first and second vertical gate electrode portions AGV1 and AGV2 has a structure in which a second electrode width ELV2 is shorter than a first electrode width ELV1. In other words, the first vertical gate electrode portion AGV1 and the second vertical gate electrode portion AGV2 have a reverse tapered shape in which a bottom surface side of the vertical gate electrode portion AGV is narrow in cross-sectional view.

As described above, the amplification transistor 216 has the FinFET structure in which the fin portion 331 forming the channel region is interposed between the first vertical gate electrode portion AGV1 and the second vertical gate electrode portion AGV2 embedded in the depth direction from the front surface 301a (substrate surface) of the semiconductor substrate 301.

Each of the first and second vertical gate electrode portions AGV1 and AGV2 has the reverse tapered shape in which the bottom surface side is narrow, and a contact area with the p-well 311 becomes smaller, so that a parasitic capacitance may be reduced. Since the parasitic capacitance may be reduced, noise generated in the amplification transistor 216 may be reduced, and an SN ratio may be improved.

Note that, the structure of the amplification transistor 226 of the reference pixel 220 is similar to that of the amplification transistor 216.

Furthermore, the second to fifth embodiments and the variations thereof may also be applied to the sixth embodiment.

In this manner, according to the sixth embodiment of the present technology, since the gate electrodes of the amplification transistors 216 and 226 have the reverse tapered shape, the contact area with the p-well may be made smaller to reduce the parasitic capacitance. Therefore, the noise generated in the amplification transistor 216 may be reduced, and the SN ratio may be improved.

<7. Application Example to Mobile Body>

The technology according to an embodiment of the present disclosure (present technology) is applicable to various products. For example, the technology according to an embodiment of the present disclosure may also be implemented as a device mounted on any type of mobile body such as an automobile, an electric automobile, a hybrid electric automobile, a motorcycle, a bicycle, a personal mobility, an airplane, a drone, a ship, and a robot.

Figure 27:
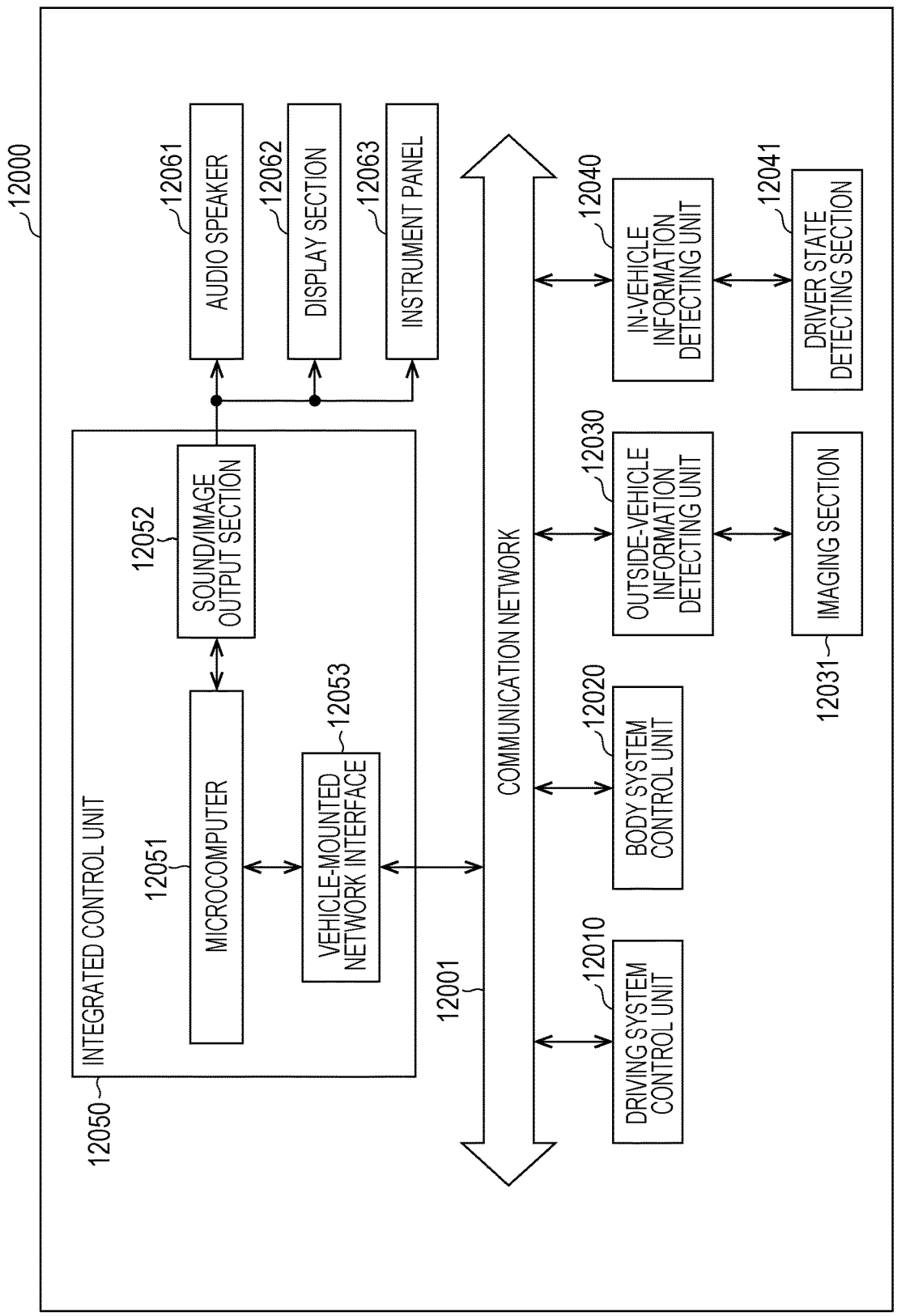
FIG. 27 is a block diagram depicting an example of schematic configuration of a vehicle control system.

FIG. 27 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 27, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 may output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 27, an audio speaker 12061, a display section 12062, and an instrument panel 12063 are illustrated as the output device. The display section 12062 may, for example, include at least one of an on-board display and a head-up display.

Figure 28:
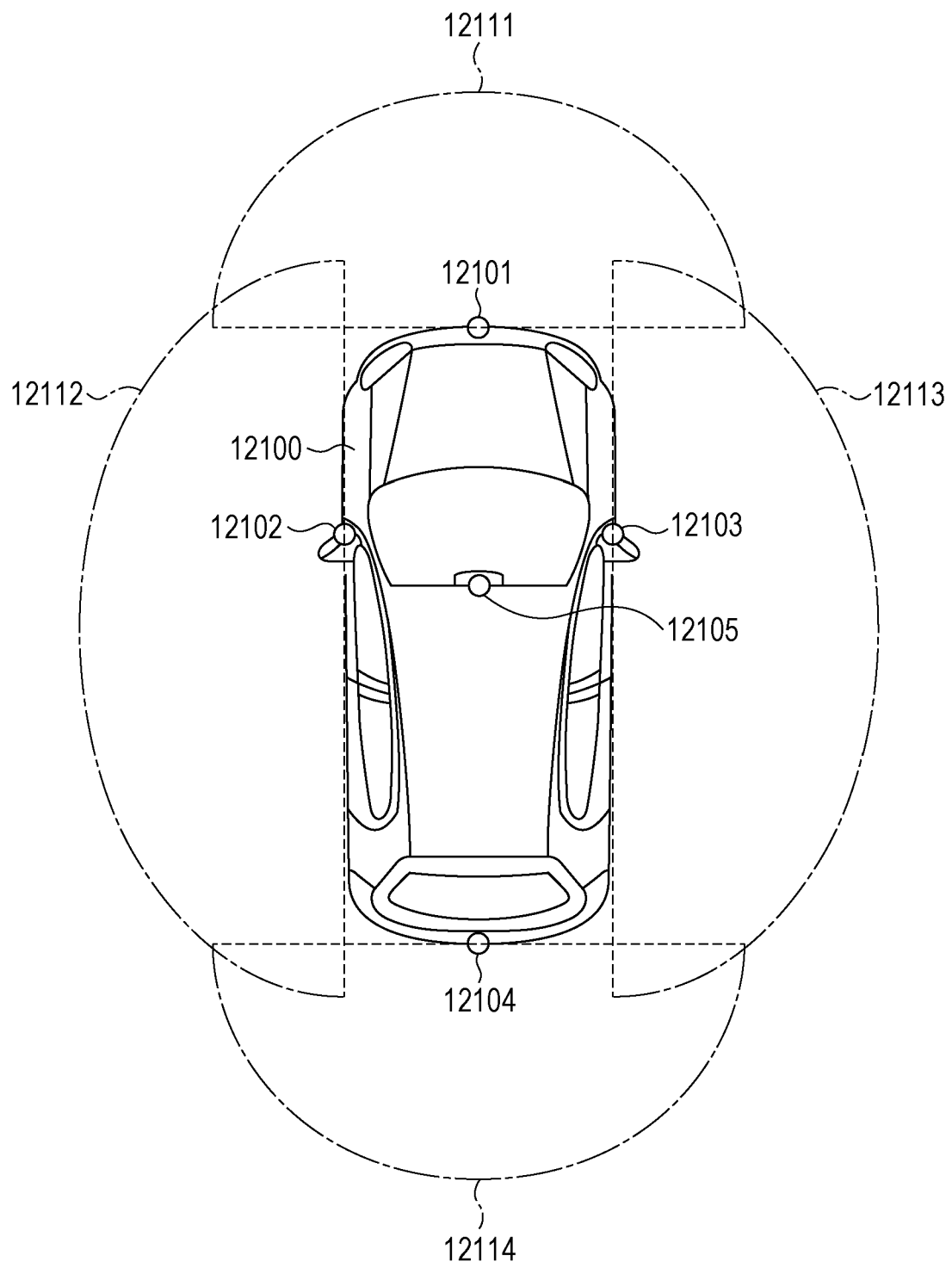
FIG. 28 is an illustrative diagram depicting an example of an installation position of an imaging section.

FIG. 28 is a diagram depicting an example of the installation position of the imaging section 12031.

In FIG. 28, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 28 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to an embodiment of the present disclosure can be applied is described above. The technology according to an embodiment of the present disclosure can be applied to the imaging section 12031 out of the configurations described above. Specifically, the CMOS image sensor 100 in FIG. 1 may be applied to the imaging section 12031. By applying the technology according to an embodiment of the present disclosure to the imaging section 12031, a variation in gain is reduced, and a more easily viewable captured image may be obtained, so that driver's fatigue may be reduced.

Note that, the above-described embodiments describe an example of embodying the present technology, and there is a correspondence relationship between items in the embodiments and the matters specifying the invention in claims. Similarly, there is a correspondence relationship between the matters specifying the invention in claims and the matters in the embodiments of the present technology having the same names. However, the present technology is not limited to the embodiments and may be embodied by variously modifying the embodiments without departing from the gist thereof.

Note that, the effect described in this specification is illustrative only and is not limitative; there may also be another effect.

Note that, the present technology may also have a following configuration.

(1) A solid-state imaging element provided with:
a reference-side amplification transistor that supplies a reference current corresponding to a predetermined reference potential;
a read-side amplification transistor that supplies a signal current corresponding to a difference between a potential of a gate and the reference potential from a drain to a source;
a pair of reset transistors that initializes the potential of the gate and the reference potential; and
a potential difference control circuit that controls a potential difference between the gate and the drain to a predetermined value when the potential of the gate and the reference potential are initialized.

(2) The solid-state imaging element according to (1) described above, in which
the potential difference control circuit includes:
a potential difference generating element that generates a predetermined potential difference;
a fixed voltage-side switch that opens and closes a path between one end of the potential difference generating element and a predetermined fixed voltage; and
a signal line-side switch that opens and closes a path between the one end of the potential difference generating element and a read-side vertical signal line that transmits the signal current, and
another end of the potential difference generating element is connected to one of the pair of reset transistors.

(3) The solid-state imaging element according to claim 2, in which the fixed voltage-side switch shifts to an open state and the signal line-side switch shifts to a closed state when the potential of the gate and the reference potential are initialized.

(4) The solid-state imaging element according to (2) or (3) described above, in which
the potential difference control circuit further includes a power supply-side switch that opens and closes a path between one of the pair of reset transistors and a predetermined power supply voltage.

(5) The solid-state imaging element according to (4) described above, in which
in a case where a differential mode in which the potential of the gate is differentially amplified is set, the power supply-side switch shifts to an open state, and in a case where a non-differential mode in which the potential of the gate is not differentially amplified is set, the power supply-side switch shifts to a closed state.

(6) The solid-state imaging element according to any one of (2) to (5) described above, further provided with:
a reference current generation circuit that generates a predetermined reference current; and
a bias circuit that supplies a bias voltage corresponding to the reference current to the potential difference control circuit, in which
the potential difference control circuit further includes a current source inserted between the another end of the potential difference generating element and a ground terminal, and
the current source generates a current corresponding to the bias voltage.

(7) The solid-state imaging element according to any one of (6) described above, in which
the reference-side amplification transistor, the read-side amplification transistor, the pair of reset transistors, the potential difference control circuit, and the bias circuit are provided on a predetermined light reception chip, and
the reference current generation circuit is provided on a predetermined circuit chip.

(8) The solid-state imaging element according to (6) described above, in which
the reference-side amplification transistor, the read-side amplification transistor, and the pair of reset transistors are provided on a predetermined light reception chip, and
the potential difference control circuit, the bias circuit, and the reference current generation circuit are provided on a predetermined circuit chip.

(9) The solid-state imaging element according to any one of (2) to (8) described above, further provided with:
a current mirror circuit; and
a parallel number control-side switch that increases the number of parallel transistors in the current mirror circuit when the potential of the gate and the reference potential are initialized.

(10) The solid-state imaging element according to (9) described above, in which
the potential difference generating element is a diode-connected transistor.

(11) The solid-state imaging element according to (9) described above, in which
the potential difference generating element is a resistance element.

(12) The solid-state imaging element according to any one of (1) to (11) described above, further provided with:
a vertical drive unit; and a system control unit, in which
the read-side amplification transistor and one of the pair of reset transistors are provided in each of a plurality of read pixels arrayed in a two-dimensional lattice pattern in a pixel array unit,
a predetermined number of potential difference control circuits are provided for each column in the pixel array unit,
the vertical drive unit sequentially selects and drives rows in the pixel array unit, and
the system control unit selects and drives any one of the predetermined number of potential difference control circuits.

(13) The solid-state imaging element according to (12) described above, in which
the system control unit randomly selects any one of the predetermined number of potential difference control circuits every time a row is read.

(14) The solid-state imaging element according to (12) described above, in which
the system control unit randomly selects any one of the predetermined number of potential difference control circuits every time all the rows are read.

(15) The solid-state imaging element according to any one of (1) to (14) described above, further provided with:
a first switch that opens and closes a path between an analog-to-digital converter and a vertical signal line that transmits the signal current; and
a second switch that opens and closes a path between the analog-to-digital converter and a predetermined vertical reset input line, in which
one of the pair of reset transistors and the potential difference control circuit are connected to each other via the vertical reset input line.

(16) The solid-state imaging element according to claim 1, in which
the read-side amplification transistor includes a gate electrode including first and second vertical gate electrode portions embedded in a depth direction from a substrate surface of a semiconductor substrate,
each of the first vertical gate electrode portion and the second vertical gate electrode portion has a structure in which a second electrode width at a second depth from the substrate surface is shorter than a first electrode width at a first depth from the substrate surface,
the first depth is a position of a channel uppermost surface closest to the substrate surface of a channel region between the first vertical gate electrode portion and the second vertical gate electrode portion,
the second depth is a position of a bottom surface of the vertical gate electrode portion farthest from the substrate surface of the first vertical gate electrode portion and the second vertical gate electrode portion, and
a direction of the first electrode width and the second electrode width is the same as a direction of a channel width of the channel region.

(17) An imaging device provided with:
a reference-side amplification transistor that supplies a reference current corresponding to a predetermined reference potential;
a read-side amplification transistor that supplies a signal current corresponding to a difference between a potential of a gate and the reference potential from a drain to a source;
a pair of reset transistors that initializes the potential of the gate and the reference potential;
a potential difference control circuit that controls a potential difference between the gate and the drain to a predetermined value when the potential of the gate and the reference potential are initialized; and
a signal processing unit that processes a pixel signal corresponding to the signal current.

REFERENCE SIGNS LIST

100 CMOS image sensor
101 Light reception chip
120 Circuit chip
110 Vertical drive unit
120 Pixel array unit
121 Read pixel region
122 Reference pixel region
130 System control unit
131 Enable signal generation unit
132 Random number generation unit
133 Control signal generation unit
134, 135 Driver
140 Column potential difference control unit
150 Column read unit
160 Column signal processing unit
170 Horizontal drive unit
180 Signal processing unit
210 Read pixel
211, 221 Photoelectric conversion element
212, 222 Transfer transistor
213, 223 Reset transistor
214, 224 Floating diffusion layer
215, 225 Selection transistor
216, 226 Amplification transistor
220 Reference pixel
230, 280 Column potential difference control circuit
231 to 233, 238, 239, 244 to 248, 272, 281 to 283, 288, 289,
291, 292 Switch
234, 236, 251, 284 nMOS transistor
235, 243, 285 Current source
237 Resistance element
240 Column read circuit
241, 242, 271 pMOS transistor
250 Bias circuit
260 Reference current generation circuit
301 Semiconductor substrate
331 Fin portion
332 Insulating film
333 Oxide film
12031 Imaging section

The invention claimed is:

1. A solid-state imaging element, comprising:
a reference-side amplification transistor that supplies a reference current corresponding to a predetermined reference potential;
a read-side amplification transistor that supplies a signal current corresponding to a difference between a potential of a gate and the predetermined reference potential from a drain to a source;
a pair of reset transistors that initializes the potential of the gate and the predetermined reference potential; and
a potential difference control circuit that controls a potential difference between the gate and the drain to a predetermined value when the potential of the gate and the predetermined reference potential are initialized.

2. The solid-state imaging element according to claim 1, wherein the potential difference control circuit includes:
a potential difference generating element that generates a predetermined potential difference;
a fixed voltage-side switch that opens and closes a path between one end of the potential difference generating element and a predetermined fixed voltage; and
a signal line-side switch that opens and closes a path between the one end of the potential difference generating element and a read-side vertical signal line that transmits the signal current, and
another end of the potential difference generating element is connected to one of the pair of reset transistors.

3. The solid-state imaging element according to claim 2, wherein
the fixed voltage-side switch shifts to an open state and the signal line-side switch shifts to a closed state when the potential of the gate and the predetermined reference potential are initialized.

4. The solid-state imaging element according to claim 2, wherein
the potential difference control circuit further includes a power supply-side switch that opens and closes a path between one of the pair of reset transistors and a predetermined power supply voltage.

5. The solid-state imaging element according to claim 4, wherein
in a case where a differential mode in which the potential of the gate is differentially amplified is set, the power supply-side switch shifts to an open state, and in a case where a non-differential mode in which the potential of the gate is not differentially amplified is set, the power supply-side switch shifts to a closed state.

6. The solid-state imaging element according to claim 2, further comprising:
a reference current generation circuit that generates a predetermined reference current; and
a bias circuit that supplies a bias voltage corresponding to the predetermined reference current to the potential difference control circuit, wherein
the potential difference control circuit further includes a current source inserted between the another end of the potential difference generating element and a ground terminal, and
the current source generates a current corresponding to the bias voltage.

7. The solid-state imaging element according to claim 6, wherein
the reference-side amplification transistor, the read-side amplification transistor, the pair of reset transistors, the potential difference control circuit, and the bias circuit are provided on a predetermined light reception chip, and
the reference current generation circuit is provided on a predetermined circuit chip.

8. The solid-state imaging element according to claim 6, wherein
the reference-side amplification transistor, the read-side amplification transistor, and the pair of reset transistors are provided on a predetermined light reception chip, and
the potential difference control circuit, the bias circuit, and the reference current generation circuit are provided on a predetermined circuit chip.

9. The solid-state imaging element according to claim 2, further comprising:
a current mirror circuit; and
a parallel number control-side switch that increases a number of parallel transistors in the current mirror circuit when the potential of the gate and the predetermined reference potential are initialized.

10. The solid-state imaging element according to claim 9, wherein
the potential difference generating element is a diode-connected transistor.

11. The solid-state imaging element according to claim 9, wherein
the potential difference generating element is a resistance element.

12. The solid-state imaging element according to claim 1, further comprising:
a vertical drive unit; and
a system control unit, wherein
the read-side amplification transistor and one of the pair of reset transistors are provided in each of a plurality of read pixels arrayed in a two-dimensional lattice pattern in a pixel array unit,
a predetermined number of potential difference control circuits are provided for each column in the pixel array unit,
the vertical drive unit sequentially selects and drives rows in the pixel array unit, and
the system control unit selects and drives any one of the predetermined number of potential difference control circuits.

13. The solid-state imaging element according to claim 12, wherein
the system control unit randomly selects any one of the predetermined number of potential difference control circuits every time a row is read.

14. The solid-state imaging element according to claim 12, wherein
the system control unit randomly selects any one of the predetermined number of potential difference control circuits every time all the rows are read.

15. The solid-state imaging element according to claim 1, further comprising:
a first switch that opens and closes a path between an analog-to-digital converter and a vertical signal line that transmits the signal current; and
a second switch that opens and closes a path between the analog-to-digital converter and a predetermined vertical reset input line, wherein
one of the pair of reset transistors and the potential difference control circuit are connected to each other via the predetermined vertical reset input line.

16. The solid-state imaging element according to claim 1, wherein
the read-side amplification transistor includes a gate electrode including first and second vertical gate electrode portions embedded in a depth direction from a substrate surface of a semiconductor substrate,
each of the first vertical gate electrode portion and the second vertical gate electrode portion has a structure in which a second electrode width at a second depth from the substrate surface is shorter than a first electrode width at a first depth from the substrate surface,
the first depth is a position of a channel uppermost surface closest to the substrate surface of a channel region between the first vertical gate electrode portion and the second vertical gate electrode portion,
the second depth is a position of a bottom surface of a vertical gate electrode portion farthest from the substrate surface of the first vertical gate electrode portion and the second vertical gate electrode portion, and a direction of the first electrode width and the second electrode width is same as a direction of a channel width of the channel region.

17. An imaging device, comprising:

a reference-side amplification transistor that supplies a reference current corresponding to a predetermined reference potential;

a read-side amplification transistor that supplies a signal current corresponding to a difference between a potential of a gate and the predetermined reference potential from a drain to a source;

a pair of reset transistors that initializes the potential of the gate and the predetermined reference potential;

a potential difference control circuit that controls a potential difference between the gate and the drain to a predetermined value when the potential of the gate and the predetermined reference potential are initialized; and a signal processing unit that processes a pixel signal corresponding to the signal current.

* * * * *